(12) United States Patent
Arai et al.

(10) Patent No.: US 7,875,922 B2
(45) Date of Patent: Jan. 25, 2011

(54) NONVOLATILE SEMICONDUCTOR MEMORY AND PROCESS OF PRODUCING THE SAME

(75) Inventors: Fumitaka Arai, Yokohama (JP); Riichiro Shirota, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 279 days.

(21) Appl. No.: 11/961,211

(22) Filed: Dec. 20, 2007

(65) Prior Publication Data

US 2008/0173928 A1 Jul. 24, 2008

(30) Foreign Application Priority Data

Dec. 21, 2006 (JP) ............... 2006-344803

(51) Int. Cl.
*H01L 29/00* (2006.01)
*H01L 21/336* (2006.01)

(52) U.S. Cl. ............... 257/316; 257/E21.409; 257/E21.69; 257/E21.691; 257/E21.693; 257/E29.3; 257/E29.309

(58) Field of Classification Search ............... 257/298, 257/316, 331, E21.409, E21.679, E21.691, 257/E21.693, E29.3, E29.309
See application file for complete search history.

(56) References Cited

U.S. PATENT DOCUMENTS

| | | | | |
|---|---|---|---|---|
| 6,133,601 | A * | 10/2000 | Watanabe | 257/314 |
| 6,440,801 | B1 * | 8/2002 | Furukawa et al. | 438/272 |
| 6,849,893 | B2 * | 2/2005 | Sommer | 257/302 |
| 2005/0063237 | A1 * | 3/2005 | Masuoka et al. | 365/222 |
| 2005/0224847 | A1 * | 10/2005 | Masuoka et al. | 257/288 |
| 2006/0049449 | A1 | 3/2006 | Iino et al. | |
| 2006/0091556 | A1 * | 5/2006 | Shigeoka | 257/773 |

(Continued)

FOREIGN PATENT DOCUMENTS

JP 10-93083 4/1998

(Continued)

OTHER PUBLICATIONS

U.S. Appl. No. 12/394,929, filed Feb. 27, 2009, Shiino, et al.

(Continued)

*Primary Examiner*—Matthew E Warren
*Assistant Examiner*—David Spalla
(74) *Attorney, Agent, or Firm*—Oblon, Spivak, McClelland, Maier & Neustadt, L.L.P.

(57) ABSTRACT

A nonvolatile semiconductor memory of an aspect of the present invention comprises a semiconductor substrate, a pillar-shaped semiconductor layer extending in the vertical direction with respect to the surface of the semiconductor substrate, a plurality of memory cells arranged in the vertical direction on the side surface of the semiconductor layer and having a charge storage layer and a control gate electrode, a first select gate transistor arranged on the semiconductor layer at an end of the memory cells on the side of the semiconductor substrate, and a second select gate transistor arranged on the semiconductor layer on the other end of the memory cells opposite to the side of the semiconductor substrate, wherein the first select gate transistor includes a diffusion layer in the semiconductor substrate and is electrically connected to the pillar-shaped semiconductor layer by way of the diffusion layer that serves as the drain region.

17 Claims, 21 Drawing Sheets

U.S. PATENT DOCUMENTS

| | | |
|---|---|---|
| 2007/0128815 A1 | 6/2007 | Iino et al. |
| 2007/0158736 A1 | 7/2007 | Arai et al. |
| 2008/0242025 A1* | 10/2008 | Kim et al. .................. 438/262 |
| 2009/0173985 A1* | 7/2009 | Lee et al. .................... 257/315 |

FOREIGN PATENT DOCUMENTS

| | | |
|---|---|---|
| JP | 2006-128390 | 5/2006 |

OTHER PUBLICATIONS

U.S. Appl. No. 12/404,804, filed Mar. 16, 2009, Sakaguchi et al.

U.S. Appl. No. 12/405,544, filed Mar. 17, 2009, Sakamoto.

U.S. Appl. No. 12/508,904, filed Jul. 24, 2009, Kamigaichi, et al.

U.S. Appl. No. 12/244,307, filed Oct. 2, 2008, Mizukami, et al.

* cited by examiner

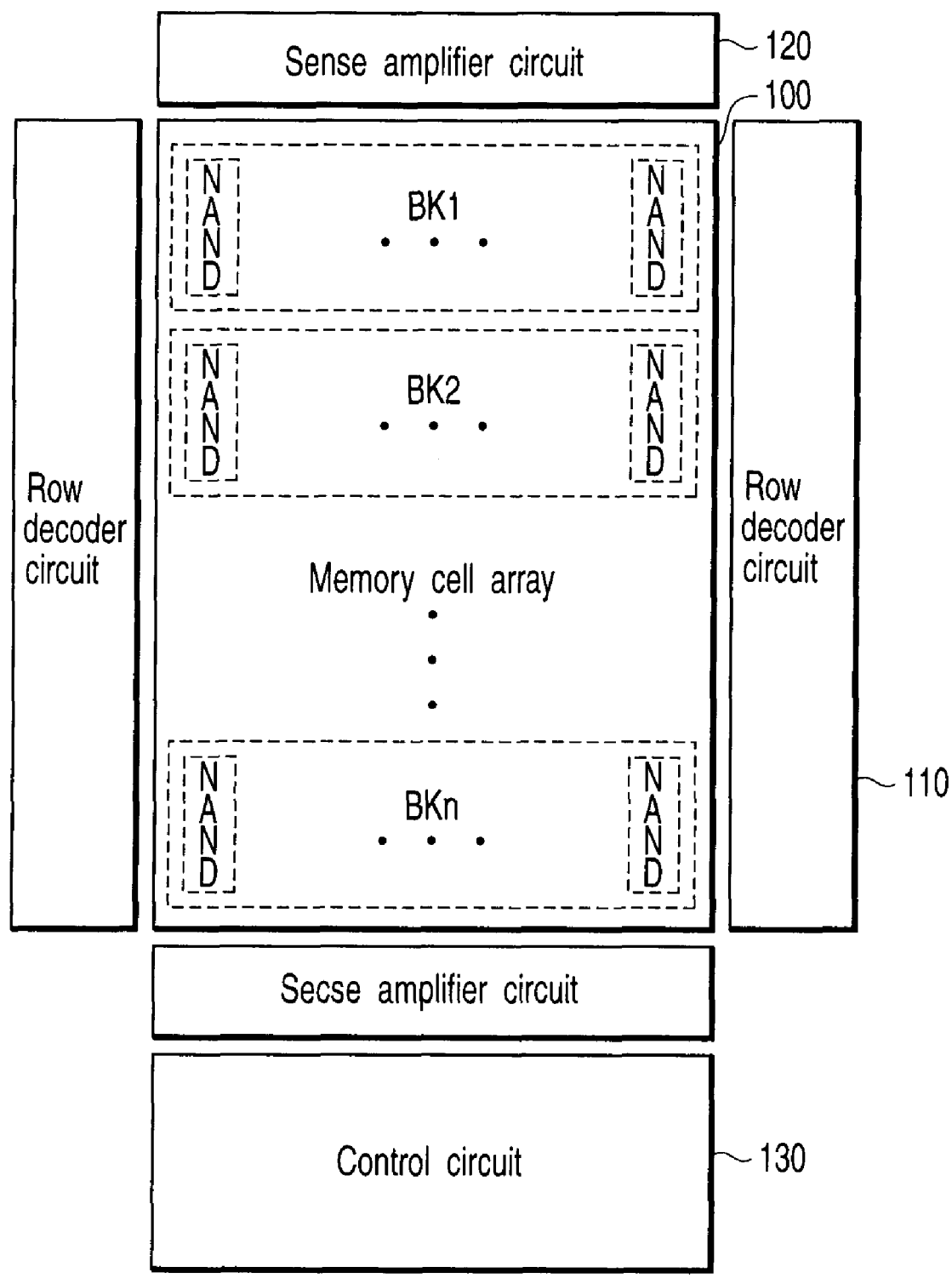
F I G. 1

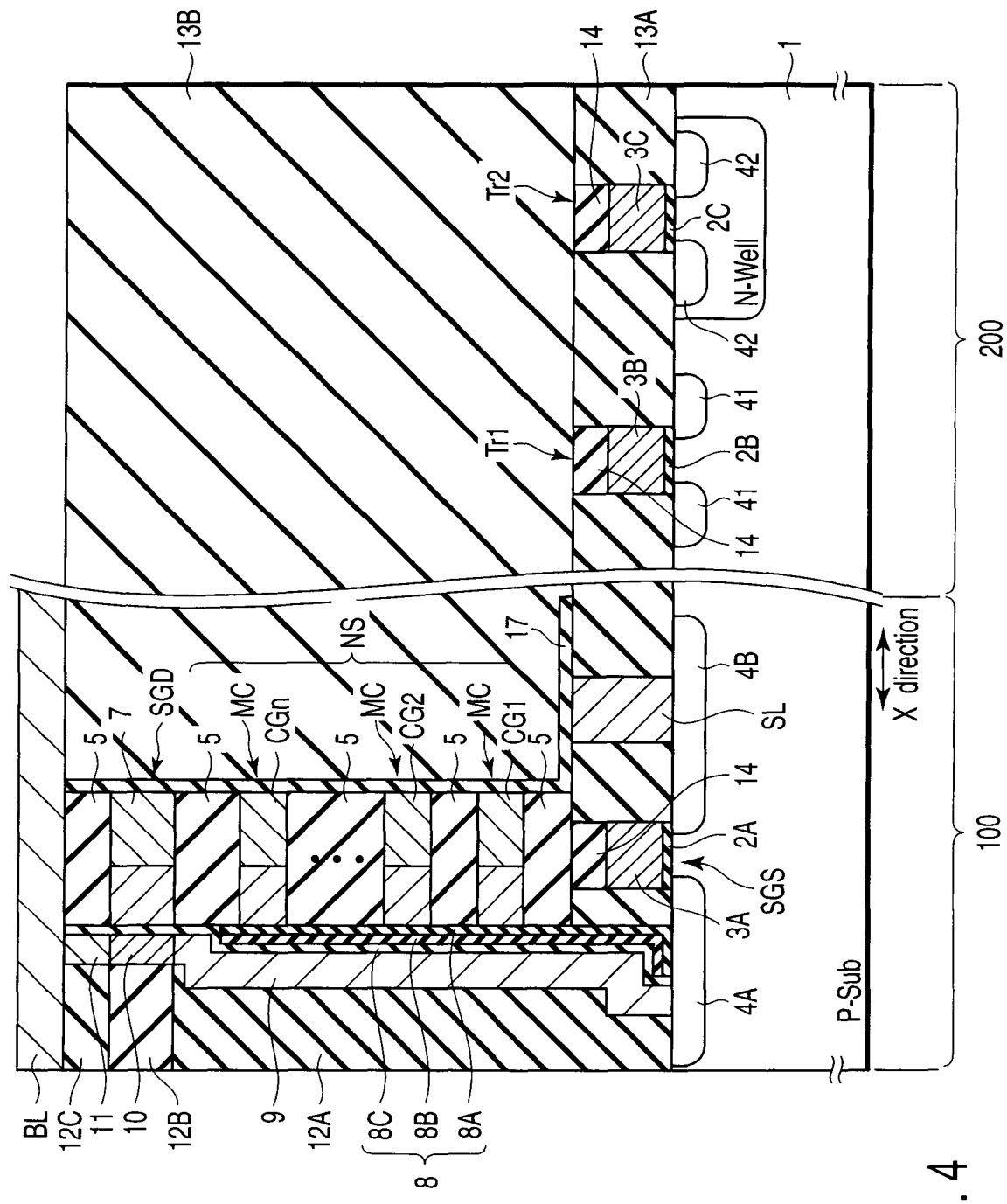
F I G. 4

NONVOLATILE SEMICONDUCTOR MEMORY AND PROCESS OF PRODUCING THE SAME

CROSS-REFERENCE TO RELATED APPLICATIONS

This application is based upon and claims the benefit of priority from prior Japanese Patent Application No. 2006-344803, filed Dec. 21, 2006, the entire contents of which are incorporated herein by reference.

BACKGROUND OF THE INVENTION

1. Field of the Invention

The present invention relates to a nonvolatile semiconductor memory, especially to a flash memory using memory cells in each of which a charge storage layer and a gate electrode are stacked together.

2. Description of the Related Art

A nonvolatile semiconductor memory such as a NAND-type semiconductor memory has been employed as a memory device for various kinds of electronic equipment.

Recently, memory cells are more finely designed than ever in order to increase their memory capacities and integration densities. There is a limit, however, to reduction of processing measurements and physical dimensions of the memory cells because these factors depend on the manufacturing equipment.

In the efforts of the above, a NAND-type flash memory has been suggested, with a three-dimensional structure of memory cells stacked in a vertical direction with respect to the surface of the semiconductor substrate (see Jpn. Pat. Appln. KOKAI Publication No. 10-93083, for example).

Among NAND-type flash memories, there is a type that has a structure in which memory cells each having a floating gate electrode on the side wall of a U-shaped groove formed in the semiconductor substrate are arranged (see Jpn. Pat. Appln. KOKAI Publication No. 2006-128390, for example). In such a structure, an etching process or the like has to be performed on a polysilicon film deposited on the side surface of the groove, which requires a high decree of manufacturing techniques.

For this reason, a NAND-type flash memory of a vertically-stacked type using a metal-oxide-nitride-oxide-semiconductor (MONOS) to make the process of manufacture easier.

When memory cells are designed to have a MONOS structure, select gate transistors that are formed at the same processing step as the memory cell are also completed with a MONOS structure. A select gate transistor on the upper end of the memory cell can be readily etched, and thus a charge storage layer can also be readily removed, turning the transistor into a metal-insulator-semiconductor (MIS) structure in which a threshold voltage can be easily controlled. On the other hand, for a select gate transistor on the bottom end of the memory cell, or in other words, on the semiconductor substrate side, a charge storage layer is very difficult to remove so that that the transistor remains as the MONOS structure. When such a select gate transistor is driven, the charge storage layer carries charge, which makes the threshold voltage difficult to control. In order to cut this off, a negative potential is required. Then, a negative potential generating and controlling circuit has to be added.

Furthermore, in a NAND-type flash memory, a memory cell array region and a peripheral circuit for controlling the memory cells are arranged on a single chip. When the memory cell array region is designed to have a vertical structure, a large step height is created between the top end of the memory cell array region and the top surface of the semiconductor substrate on which the peripheral transistors are formed. With such a step height, the processing of the peripheral transistors which is conducted after the formation of the memory cell array region becomes very difficult.

BRIEF SUMMARY OF THE INVENTION

A nonvolatile semiconductor memory of an aspect of the present invention comprises: a semiconductor substrate; a pillar-shaped semiconductor layer extending in a vertical direction with respect to a surface of the semiconductor substrate; a plurality of memory cells arranged in the vertical direction on a side surface of the semiconductor layer and having a charge storage layer and a control gate electrode; a first select gate transistor arranged on the semiconductor substrate at an end of the memory cells on the side of the semiconductor substrate; and a second select gate transistor arranged on the side surface of the semiconductor layer on an end of the memory cells opposite to a side of the semiconductor substrate, wherein the first select gate transistor includes a diffusion layer that serves as the source and drain regions in the semiconductor substrate and is electrically connected to the semiconductor layer by way of the diffusion layer.

A nonvolatile semiconductor memory of an aspect of the present invention comprises: a semiconductor substrate; first and second pillar-shaped semiconductor layers extending in a vertical direction with respect to a surface of the semiconductor substrate; a plurality of first memory cells arranged in the vertical direction on a side surface of the first semiconductor layer and having a charge storage layer and a control gate electrode; a first drain-side select gate transistor arranged on the side surface of the first semiconductor layer at an end of the first memory cells opposite to the semiconductor substrate; a plurality of second memory cells arranged in the vertical direction on a side surface of the second semiconductor layer and having a charge storage layer and a control gate electrode; a second drain-side select gate transistor arranged on a side surface of the second semiconductor layer at an end of the second memory cells opposite to the semiconductor substrate; and a source-side select gate transistor arranged on the semiconductor substrate at the end of the first and second memory cells on the side of the semiconductor substrate, wherein the source-side select gate transistor includes a diffusion layer that serves as source and drain regions in the semiconductor substrate and is electrically connected to the first and second semiconductor layers by way of the diffusion layer.

A method of manufacturing a nonvolatile semiconductor memory of an aspect of the present invention comprises steps of: forming a gate electrode of a first select gate transistor on a gate insulating film deposited on a surface of a semiconductor substrate; forming a diffusion layer to serve as source and drain regions of the first select gate transistor by using the gate electrode as a mask; alternately depositing interlayer insulating films and control gate electrode material of memory cells on the gate electrode; forming gate electrode material of a second select gate transistor on an interlayer insulating film positioned at an end opposite to the semiconductor substrate; sequentially etching the gate electrode material of the second select gate transistor, the control gate electrode material and the interlayer insulating films and thereby exposing a top surface of the diffusion layer to serve as the drain region of the first select gate transistor; forming a first insulating film on a side surface of the control gate electrode material and the gate electrode material of the second select gate transistor; forming a charge storage layer on a side surface of the first insulating film; removing portions of the first insulating film and the charge storage layer deposited on the side surface of a gate electrode of the second select gate transistor; forming a second insulating film on the side surface of the charge storage layer and the gate electrode of the second select gate transistor; and forming a pillar-shaped semiconductor layer on a side surface of the second insulating film.

BRIEF DESCRIPTION OF THE SEVERAL VIEWS OF THE DRAWING

FIG. 1 is a schematic view of a flash memory.
FIG. 4 is a cross-sectional view of the structure of FIG. 3 along the line IV-IV.

DETAILED DESCRIPTION OF THE INVENTION

Figure 2:
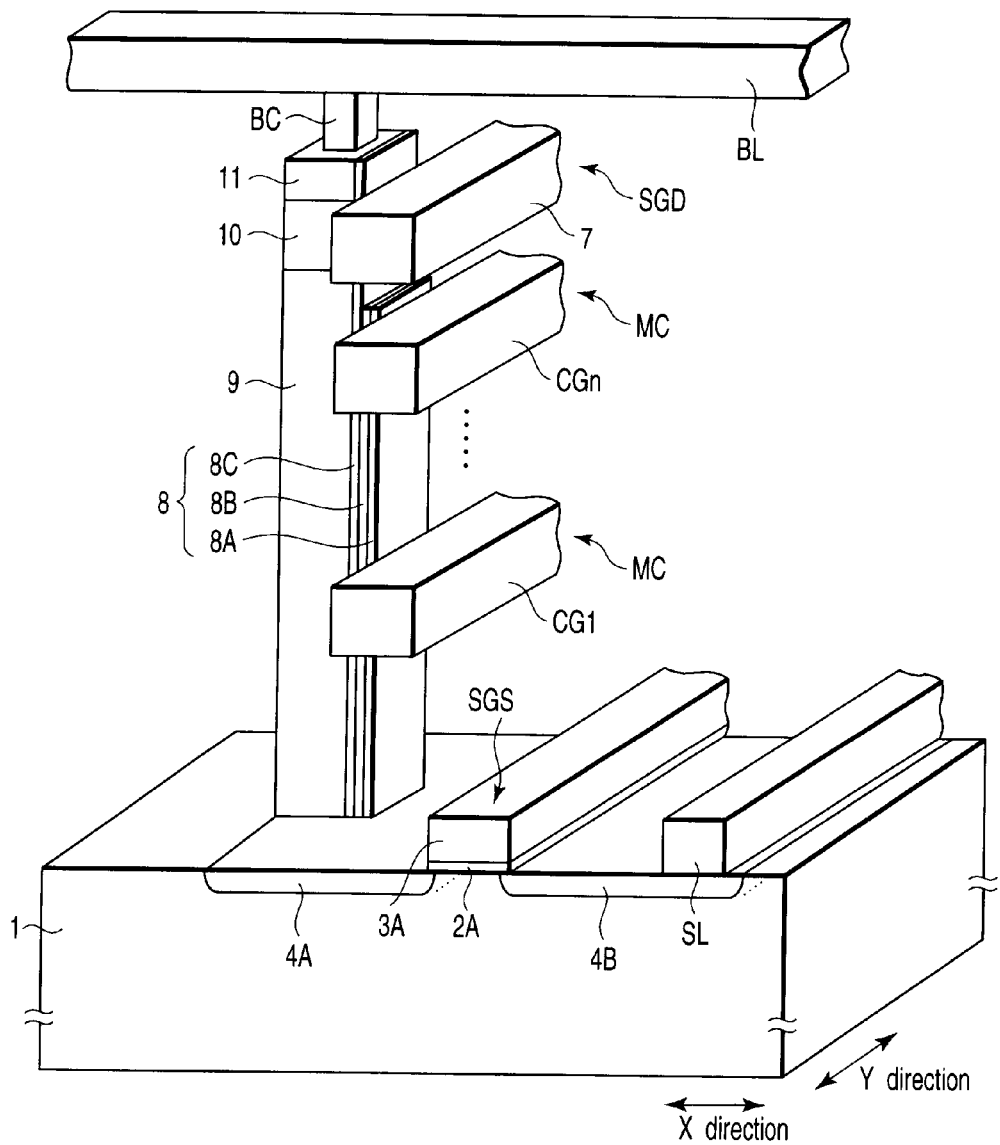
FIG. 2 is a perspective view of the main part of a flash memory according to an aspect of the present invention.

Embodiments of the present invention will be explained in detail below with reference to the attached drawings.

1. Overview

A nonvolatile semiconductor memory according to an aspect of the present invention includes multiple vertical memory cell transistors arranged along a side surface of a pillar-shaped semiconductor layer extending in a vertical direction with respect to the surface of the semiconductor substrate. The source/drain regions of the vertical memory cell transistors are arranged in the semiconductor layer. The source/drain regions of one memory cell transistor are shared with other memory cell transistors so that the memory cell transistors are connected to one another in series. A group of memory cell transistors connected in series form a memory cell string. Select gate transistors are arranged on the two sides of the memory cell string, and one of the select gate transistors arranged on the lower end of the memory cell string (on the semiconductor substrate side) is arranged on the semiconductor substrate. A diffusion layer formed in the semiconductor substrate serves as source/drain regions of this select gate transistor. The select gate transistor positioned on the lower side of the memory cell string is electrically connected to the semiconductor layer on which the memory cell is arranged, via the diffusion layer formed in the semiconductor substrate. In addition, this select gate transistor is an MIS transistor having the same structure as the peripheral transistors.

It should be noted that a vertical memory cell and a vertical transistor indicate transistors whose channel is formed in a vertical direction with respect to the surface of the semiconductor substrate.

As in the above structure, the select gate transistor positioned on the lower side is deposited on the semiconductor substrate separately from the MONOS-structured vertical memory cell. As a result, the select gate transistor positioned on the lower side can be obtained as a MIS-structured transistor in which the threshold voltage can be readily controlled, without requiring a high-level manufacturing technique.

The peripheral circuit region is provided on the chip on which the memory cell array region having memory cells is provided. The peripheral transistors of the peripheral circuit region are formed at the timing of forming the select gate transistor on the semiconductor substrate on the lower side of the memory cell string.

For this reason, the peripheral transistors are formed without a large height difference between the memory cell array region and the peripheral circuit region. This lowers the level of technique required for the manufacturing process.

Hence, a nonvolatile semiconductor memory in which memory cells are stacked to attain a finer pattern can be readily produced without a high level of processing technique.

2. Aspects of the Invention

Several aspects of the present invention will be explained below.

(A) Structure of Basic Unit

FIG. 1 is a schematic view of the structure of a flash memory. The flash memory comprises a memory cell array region 100, row decoder circuits 110 for controlling the memory cell array region 100, sense amplifier circuits 120, and a control circuit 130 on a single chip. Hereinafter, the region surrounding the memory cell array region 100, in which the row decoder circuits 110 and other circuits are arranged will be referred to as a peripheral circuit region.

The memory cell array region 100 includes multiple blocks, BK1, BK2 . . . , and BKn. When the memory cell array region has a NAND-type structure, each of these blocks includes multiple NAND cell units. The peripheral circuit region includes MIS-structured peripheral transistors as its main components.

Figure 3:
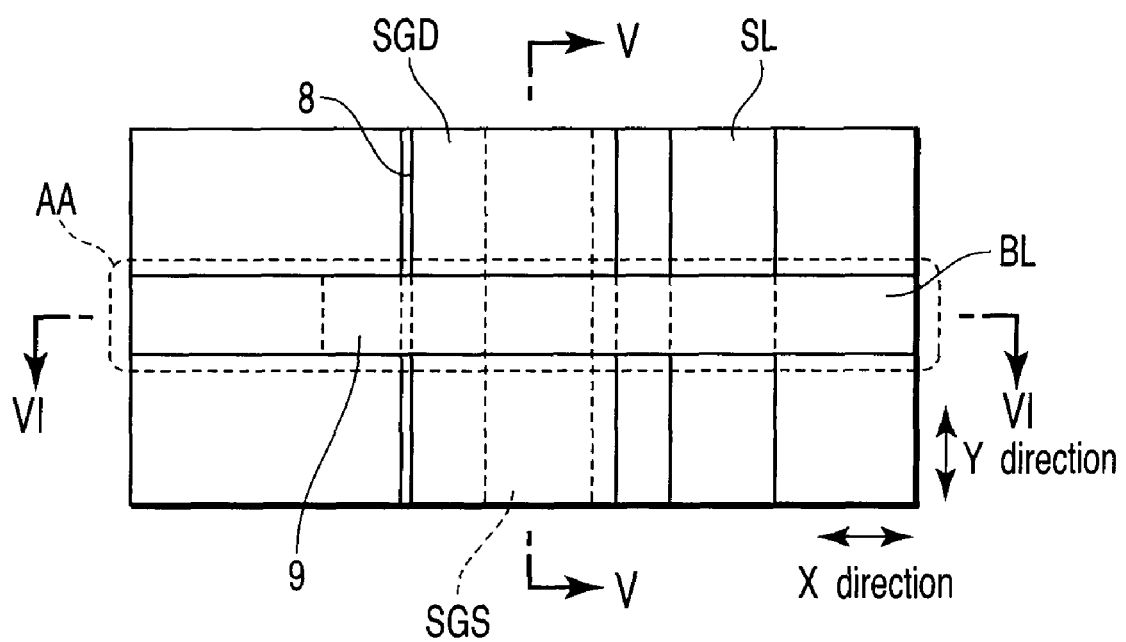
FIG. 3 is a plan view of a NAND cell unit according to the aspect of the present invention.
Figure 5:
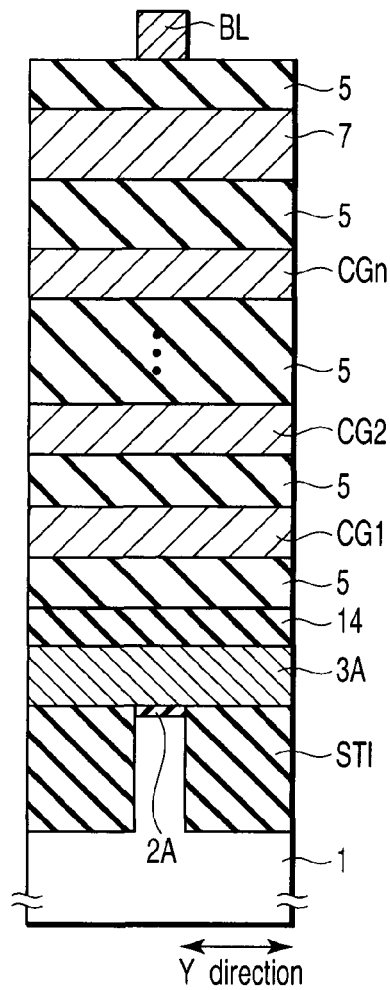
FIG. 5 is a cross-sectional view of the structure of FIG. 3 along the line V-V.

FIG. 2 is a perspective view of the main part of a NAND cell unit that serves as a basic unit. FIG. 3 is a plan view of the main part of the NAND cell unit that serves as a basic unit. FIG. 4 is a cross-sectional view of the structure of FIG. 3 along the line IV-IV, while FIG. 5 is a cross-sectional view of the structure of FIG. 3 along the line V-V. For the sake of convenience, interlayer insulating films 5 are omitted from the structure of FIG. 2. FIG. 4 also includes the structure of the peripheral transistors arranged in a peripheral circuit region 200.

A NAND cell unit includes multiple memory cells MCs that are connected to one another in series and select gate transistors SGD and SGS that are arranged at the two ends of the memory cells. Hereinafter, the memory cells MCs connected in series will be referred to as a NAND string NS.

According to the present embodiment, the memory cell MCs are formed on the side surface of a pillar-shaped semiconductor layer that extends substantially in a vertical direction with respect to the surface of a semiconductor substrate 1 so as to be a vertical memory cell.

The NAND string NS therefore has a layer structure in which multiple vertical memory cells MC are stacked together, with interlayer insulating films 5 interposed therebetween.

Control gate electrodes CG1 to CGn extend in the Y direction parallel to the main surface of the semiconductor substrate 1, and are arranged at certain spacing in a vertical direction with respect to the main surface of the semiconductor substrate 1. Each of the memory cells MCs is positioned at an intersection point of a pillar-shaped $N^-$-type semiconductor layer 9 and one of the gate electrodes CG1 to CGn.

The control gate electrodes CG1 to CGn have a double-layer structure of a polysilicon layer and a silicide layer formed by siliciding part of the polysilicon layer in order to lower the resistance. The control gate electrodes CG1 to CGn may be configured, however, to have a single-layer structure of a polysilicon layer or a silicide layer. Furthermore, the control gate electrodes CG1 to CGn may also be configured to have a single-layer structure of a metal such as tungsten (W), aluminum (Al) and copper (Cu) in order to lower the resistance. When a metal is adopted for the control gate electrodes CG1 to CGn, a silicide layer is not required.

Each memory cell MC configured in such a manner has a MONOS structure where a gate insulating film 8 deposited between the control gate electrodes CG1 to CGn and the $N^-$-type semiconductor layer 9 has a layer structure of a charge storage layer 8B sandwiched in between a first insulating film 8A and a second insulating film 8C.

The first insulating film 8A is deposited between the charge storage layer 8B and one of the control gate electrodes CG1 to CGn so as to prevent the charge stored in the charge storage layer 8B from diffusing into the control gate electrodes CG1 to CGn. The first insulating film 8A is, for example, a silicon oxide film, and has a thickness of approximately 10 nanometers.

The charge storage layer 8B is, for example, a silicon nitride film, and acquires and stores charge (electrons) therein. The thickness of the charge storage layer 8B is approximately 8 nanometers.

The second insulating film 8C serves as a potential barrier when the charge storage layer 8B captures charge from the $N^-$-type semiconductor layer 9 or when the charge stored in the charge storage layer 8B diffuses into the $N^-$-type semiconductor layer 9. The second insulating film 8C is, for example, a silicon oxide film, and has a thickness of approximately 4 nanometers.

The memory cell according to the present embodiment is a depression-type MIS transistor. Furthermore, the memory cell of the NAND-type flash memory can execute a normal write/read operation without a diffusion layer that serves as source/drain regions, as its pattern becomes finer. Thus, the memory cell MC does not need to include a diffusion layer in the pillar-shaped $N^-$-type semiconductor layer 9 as its source/drain regions having a conductive type opposite to this semiconductor layer 9. In addition, as the distance between the memory cells becomes shorter due to the pattern that becomes finer, an $n^+$-type diffusion layer of a higher impurity content than the $n^-$-type semiconductor layer 9 does not need to be formed as the source/drain regions of the memory cell MCs. This is because the memory cells can pass a sufficient amount of current without an $n^+$-type diffusion layer. In other words, the $N^-$-type semiconductor layer 9 itself functions as the channel, source, and drain regions of the memory cell. The memory cell MC realizes an off state by bringing the $N^-$-type semiconductor layer 9 immediately under the gate electrodes CG1 to CGn into depletion in accordance with the potential applied to the gate electrodes.

Figure 6:
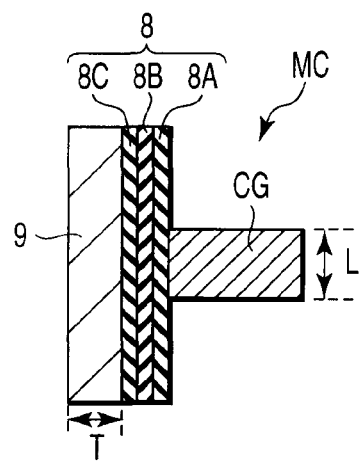
FIG. 6 is a cross-sectional view of a memory cell.

FIG. 6 is a cross-sectional view of one of the memory cells illustrated in FIG. 4. As described above, the memory cell according to the present invention is of a vertical type. The gate length (channel length) of the memory cell is therefore the thickness of the gate electrode CG. It is assumed that the gate length is L, and that the thickness of the $n^-$-type semiconductor layer 9 that serves as an active region of the memory cell MC is T.

The gate length L and the thickness T should satisfy the following expression.

This is to normally and readily perform a data reading operation.

$$1\ nm < T < L \times 0.8$$

In particular, an inversion layer is formed in the channel region immediately under the gate electrode CG within a range of approximately 1 nanometer from the interface between the channel region and the gate insulating film 8. When the thickness T is smaller than 1 nanometer, the carrier surface density of the inversion layer suddenly decreases, which reduces the current through the bit line. Then, the data reading operation becomes difficult.

On the other hand, the cut-off property of the memory cell transistor has to be maintained at a high level in order to achieve a normal reading operation. For this reason, the upper limit of the thickness T should satisfy the above expression.

As mentioned above, the memory cell MC has a MONOS structure having the charge storage layer 8B. Because the entire gate insulating film 8 of the memory cell MC including the charge storage layer 8B is an insulator, the memory cell MC does not need to include floating gate electrodes that have to be separated from one another in accordance with each cell, unlike a memory cell of a floating gate type. In other words, the gate insulating film 8 can be formed entirely on the side surface of the $n^-$-type semiconductor layer 9, and there is no need for patterning. Hence, a structure of vertical memory cells stacked in a vertical direction can be readily attained.

Furthermore, the first and second select gate transistors SGS and SGD are arranged at the ends of the NAND string NS. The gate electrodes of the first and second select gate transistors SGS and SGD extend in the Y direction as indicated in FIG. 3.

Of these select gate transistors, the second select gate transistor SGD at one end (on the drain side) of the NAND string is positioned at the top end of the stacked body of the memory cells, and formed into a vertical transistor having a P⁻-type semiconductor layer 10 connected to the N⁻-semiconductor layer 9 as a channel region.

The P⁻-type semiconductor layer 10 is a semiconductor layer doped with P⁻-type impurities in low concentration (about $1\times10^{18}$ atom/cm³, for example).

Moreover, the second select gate transistor SGD includes the N⁻-semiconductor layer 9 on which a memory cell is provided as a source region and an N⁺-type semiconductor layer 11 connected to the P⁻-type semiconductor layer 10 as a drain region. The N⁺-type semiconductor layer 11 is a semiconductor layer doped with N⁺-type impurities in high concentration (about $1\times10^{20}$ atom/cm³, for example). A bit line BL is connected to this N⁺-type semiconductor layer 11. By forming the source and drain regions in an asymmetrical manner, errors associated with the GIDL current can be reduced in writing data into the memory cell. The contact resistance in the bit line BL can also be lowered.

The select gate transistor SGD uses as a gate insulating film the second insulating film 8C of the gate insulating film 8 in the layer structure of the memory cell. Because the select gate transistor SGD positioned at the top end of the structure may be easily processed, the second insulating film 8C is deposited after the charge storage layer 8B and the first insulating film 8A of the gate insulating film 8 are removed from the channel region of the select gate transistor SGD. The above structure is thereby obtained. For the select gate transistor SGD, a separately formed insulating film may be used as its gate insulating film instead of the second insulating film 8C. Alternatively, the charge storage layer 8B and the second insulating film 8C are removed, the first insulating film 8A may be used as its gate insulating film.

Because the select gate transistor SGD is a vertical transistor, its gate length is defined by the thickness of the gate electrode. The gate length (thickness) of the select gate transistor SGD is designed to be larger than the gate length (thickness) of the memory cell. The cut-off characteristics of the select gate transistor SGD can be thereby maintained at an excellent level. For instance, when the gate length (thickness) of the gate electrode of the memory cell is approximately 30 nanometers, the gate length (thickness) of the select gate transistor SGD is set to approximately 150 nanometers. Furthermore, the distance between two adjacent gate electrodes, or in other words the thickness of the interlayer insulation layer 5, is determined to be the same as the thickness of each of the gate electrodes CG1 to CGn.

On the other hand, the first select gate transistor SGS at the other end (on the source side) of the NAND string is arranged on the semiconductor substrate 1. A certain distance is maintained between the select gate transistor SGS and the N⁻-semiconductor layer 9 so as to ensure the dielectric withstand voltage.

The select gate transistor SGS has a gate electrode 3A on a gate insulating film 2A that is deposited on the surface of the semiconductor substrate 1.

In this select gate transistor SGS, N-type diffusion layers 4A and 4B formed in the semiconductor substrate 1 serve as its source and drain regions.

The diffusion layer 4A, which serves as the drain region of the select gate transistor SGS, is connected to the pillar-shaped N⁻-semiconductor layer 9. Moreover, the diffusion layer 4B, which serves as the source region, is connected to a source line SL that extends in the Y direction.

The source line SL is formed in an insulation layer 13A. The top surface of the source line SL is provided at a lower position than the bottom of a control gate electrode CG1 that is the closest to the semiconductor substrate 1 among the control gate electrodes CG1 to CGn.

In such a structure, the source line SL is not adjacent to the NAND string NS. Thus, the distance between the NAND string and the source line SL does not have to be widened in order to increase the dielectric withstand voltage between the NAND string and the source line SL. As a result, the size of the chip can be reduced.

Moreover, it is preferable that the select gate transistor SGS be positioned beneath the layered body of the control gate electrodes CG1 to CGn of the memory cells and the interlayer insulating films 5 in order to reduce the size of the chip. In such a structure, a masking material 14 arranged on the interlayer insulating film 5 and the gate electrode 3A is interposed between the select gate transistor SGS and the gate electrode CG1 so as to prevent them from affecting each other. This ensures a sufficient distance between the select gate transistor SGS and the gate electrode CG1.

Peripheral transistors Tr1 and Tr2 arranged in the peripheral circuit region 200 use the diffusion layers 41 and 42 in the semiconductor substrate 1 as the source and drain regions in the same manner as the select gate transistor SGS on the semiconductor substrate. Further, the peripheral transistors Tr1 and Tr2 include gate electrodes 3B and 3C on gate insulating films 2B and 2C deposited on the surface of the semiconductor substrate 1.

The peripheral transistors Tr1 and Tr2 are formed at the same timing as the select gate transistor SGS. For this reason, in order to attain the structure according to the present embodiment, the memory cell MC is formed after the select gate transistor SGS and the peripheral transistors Tr1 and Tr2 are formed on the semiconductor substrate 1.

As described above, the select gate transistor SGD that is positioned at the top end of the pillar-shaped semiconductor layers 9, 10 and 11 can be easily processed. Thus, the charge storage layer is removed from the top of the channel region of the select gate transistor SGD, and a MIS transistor having the second insulating film 8C as a gate insulating film is completed. Furthermore, the select gate transistor SGD is completed as a P-channel enhancement-type MIS transistor, including the P⁻-type semiconductor layer 10 formed in the pillar-shaped semiconductor layer as a channel region, the N⁻-type semiconductor layer 9 as a source region, and the N⁺-type semiconductor layer 11 as a drain region.

On the other hand, the select gate transistor SGS on the source side has the gate electrode 3A on the gate insulating film 2A deposited on the surface of the semiconductor substrate 1, and includes the diffusion layers 4A and 4B formed in the P-type semiconductor substrate 1 as the source and drain regions.

Unlike a transistor formed on the side surface of the pillar-shaped semiconductor layer 9, this select gate transistor SGS is formed on the semiconductor substrate 1 at the same timing as the peripheral transistors Tr1 and Tr2. Thus, there is no charge storage layer between the gate electrode 3A and the gate insulating film 2A. For this reason, the select gate transistor SGS can be formed as a P-channel enhancement-type MIS transistor, in which the threshold voltage can be easily controlled, without a high level of processing technique.

In addition, the peripheral transistors are formed at the same timing as the select gate transistor SGS deposited on the semiconductor substrate 1. As a result, the peripheral transistors can be formed without a height difference between the surface of the semiconductor substrate and the top surface of the layer structure of the memory cells MC and the interlayer insulating films 5. This facilitates the processing of the peripheral circuit region.

Hence, a NAND-type flash memory, in which vertical memory cells are stacked in order to realize a finer pattern, can be processed without a high level of technique.

(B) Embodiments

(1) Structure

An embodiment utilizing the above NAND cell unit will be explained below. The same reference numbers are used for the same components, and the explanation thereof is omitted.

Figure 7:
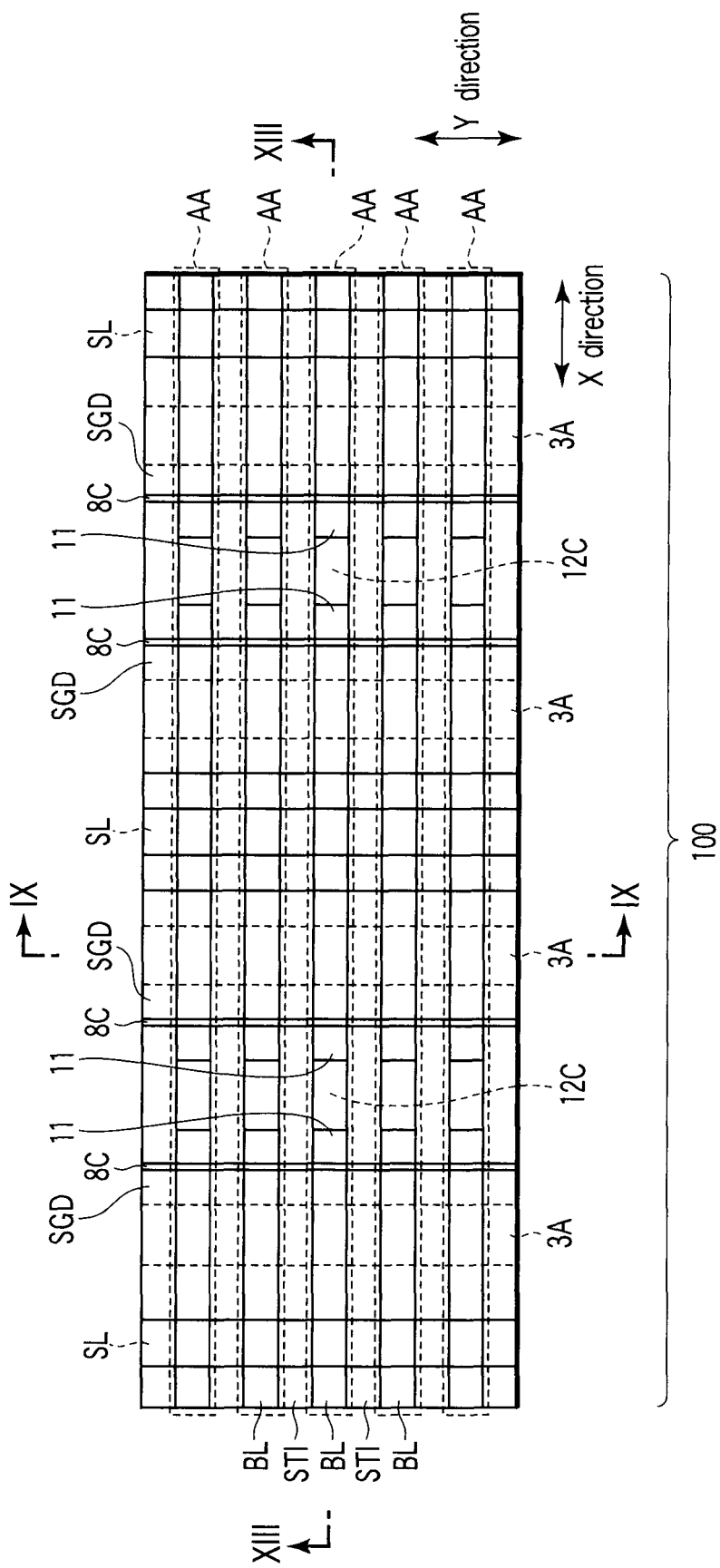
FIG. 7 is a plan view of a memory cell array region according to an embodiment of the present invention.
Figure 8:
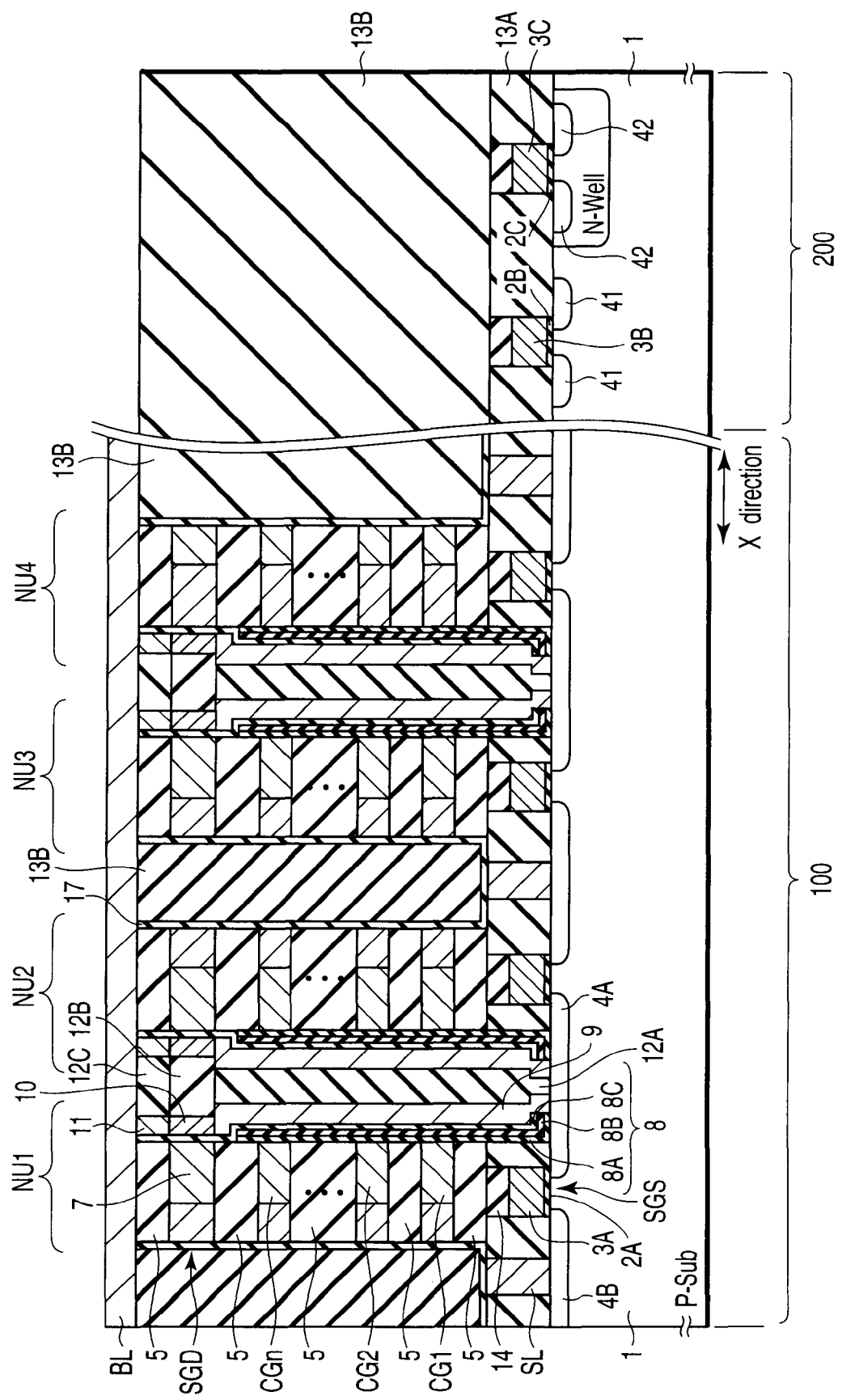
FIG. 8 is a cross-sectional view of the structure of FIG. 7 along the line VIII-VIII.
Figure 9:
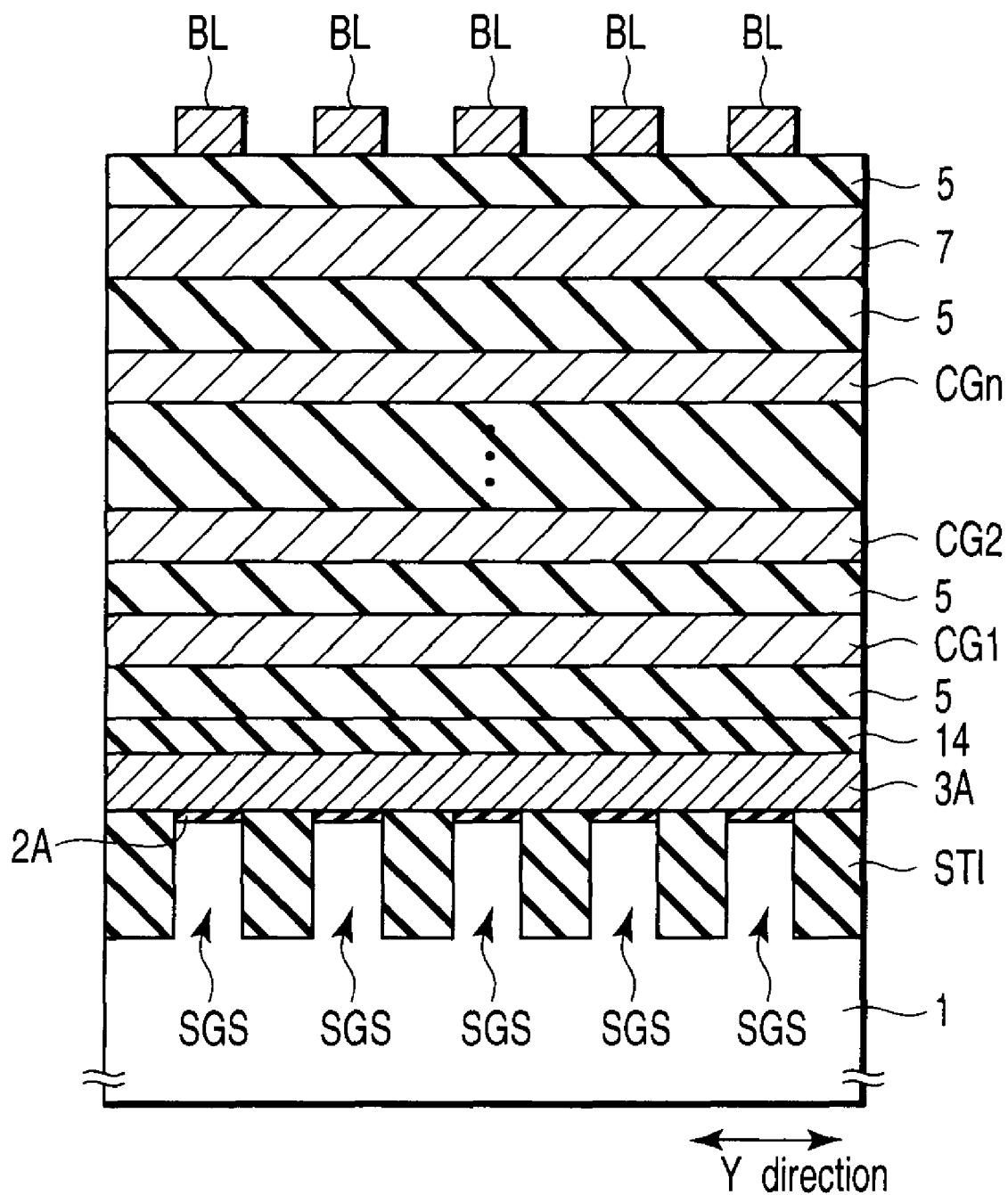
FIG. 9 is a cross-sectional view of the structure of FIG. 7 along the line IX-IX.

FIG. 7 is a plan view of the present embodiment. FIG. 8 is a cross-sectional view of the structure of FIG. 7 along the line VIII-VIII, while FIG. 9 is a cross-sectional view of the structure of FIG. 7 along the line IX-IX.

In the memory cell array region 100, NAND cell units NU1 to NU4 are arranged in an active region AA that extends in the X direction. Isolation regions STI are provided between any two active regions AA that are adjacent to each other in the Y direction.

The control gate electrodes CG1 to CGn of the memory cells extend in the Y direction and serve as word lines.

The bit line BL extends in the X direction and is electrically connected to the $N^+$-type semiconductor layers 11 of the NAND cell units NU1 to NU4. The bit line BL is shared by any two of the NAND cell units NU1 to NU4 that are adjacent to one another with respect to the X direction.

The pillar-shaped $N^-$-type semiconductor layers 9 on which memory cells are arranged are separated from one another with respect to the X direction for each NAND cell unit.

In any two NAND cell units that are adjacent to each other in the X direction (NAND cell units NU1 and NU2, for instance), the pillar-shaped $N^-$-type semiconductor layers 9 are electrically connected to the select gate transistors SGS on the source side of their own, by way of the shared diffusion layer 4A formed in the semiconductor substrate 1.

For a pair of NAND cell units such as NU1 and NU2 that are facing to each other on their sides having no memory cells thereon, their $N^-$-type semiconductor layers 9 are arranged with a smaller spacing apart than a spacing between the select gate transistor SGS and the source line SL. This is because the potential difference does not occur between $N^-$-type semiconductor layers 9 of NU1 and NU2. As a result, the size of the chip can be reduced.

In addition, one source line SL is shared by two adjacent NAND cell units such as NU2 and NU3. The source line SL and the select gate transistor SGS are arranged with a sufficient spacing apart from each other to ensure a dielectric withstand voltage between the source line SL and the select gate transistor SGS.

In the above structure, the diffusion layer 4A connecting the $N^-$-type semiconductor layer 9 to the source-side select gate transistor SGS are shared by two NAND strings, and a single source line SL is shared by two NAND cell units. Thus, there is no need for providing any isolation region with respect to the X direction.

If NAND cell units adjacent to each other in the X direction are to be electrically insulated from each other, isolation insulating layers would need to be incorporated in the X direction, in addition to the isolation insulating layers arranged in the Y direction. In such a case, the processing must be performed by taking into account the discrepancy in alignment between the NAND cell units and the active regions. Thus, a high level of processing technique would be required.

However, in the present embodiment where the NAND cell units are arranged in the X direction, such a high level of processing technique is not required, which improves the production yield. Furthermore, because space for the X-direction isolation region is omitted, the chip area can be reduced.

The processing method according to the present embodiment will be explained below.

(2) Processing Method

Figure 10:
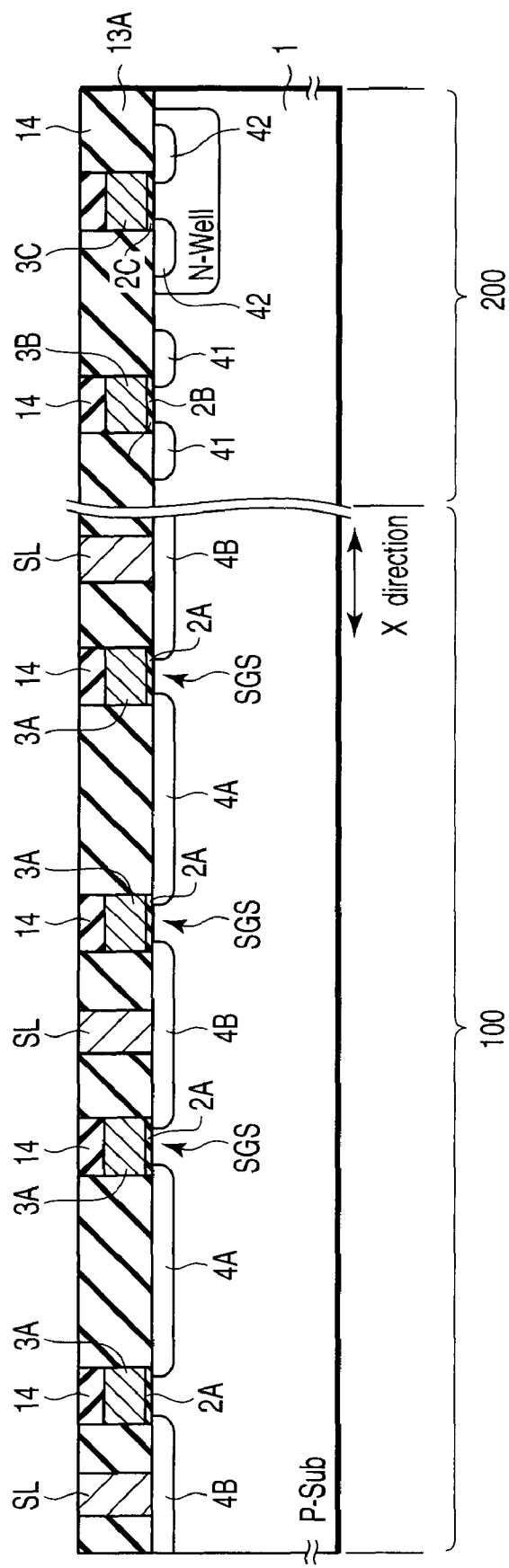
FIG. 10 is a view of a structure at a step of the manufacturing process according to an embodiment.

A well region is formed in the semiconductor substrate 1, and then a silicon oxide film is formed by thermal oxidation to serve as a gate insulating film, as illustrated in FIG. 10. Thereafter, a polysilicon film or the like and then a silicon nitride film or the like are sequentially formed on the semiconductor substrate 1 by chemical vapor deposition (CVD) to be gate electrodes and a masking material, respectively.

A pattern is provided on the masking material, the gate processing is performed by using this masking material as a mask. Then, the gate electrode 3A of the first select gate transistor and the gate electrodes 3B and 3C of the peripheral transistors are deposited on the gate insulating films 2A, 2B, and 2C, respectively, on the surface of the semiconductor substrate. Thereafter, diffusion layers 4A, 4B, 41, and 42 that serve as source and drain regions are formed in the semiconductor substrate 1 by ion implantation. As a result, select gate transistors SGS are formed in the memory cell array region 100 in the semiconductor substrate 1 and connected to the source side of the NAND string, while peripheral transistors Tr1 and Tr2 are formed in the peripheral circuit region 200 in the semiconductor substrate 1.

An insulation layer 13A is deposited by CVD and chemical mechanical polishing (CMP) in such a manner as to be flush with the top surface of the masking material 14. Furthermore, the source line SL is connected to the diffusion layer 4B, which serves as a source region of the select gate transistor SGS, through the opening formed in the insulation layer 13A. A contact plug that is to be connected to the diffusion layers 41 and 42 of the peripheral transistors may be formed at the same timing as the formation of the source line SL.

Figure 11:
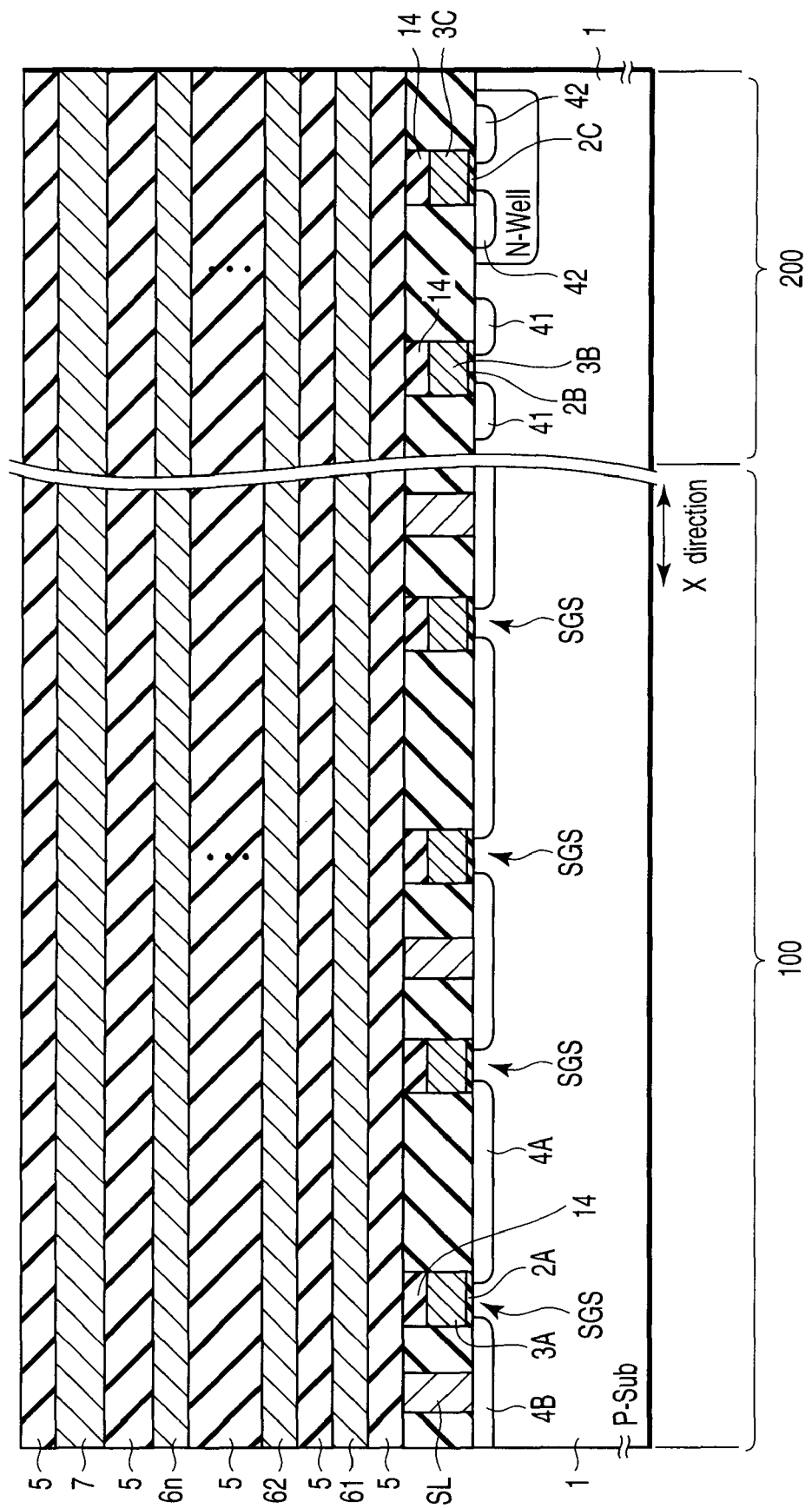
FIG. 11 is a view of a structure at another step of the manufacturing process according to the embodiment.

An illustrated in FIG. 11, the interlayer insulation layers 5 and gate electrodes 61 to 6n and 7 are alternately deposited on the insulating film 13A and the masking material 14 in a CVD process, for example.

The gate electrodes 61 to 6n serve as control gate electrodes of the memory cells, while the gate electrode 7 serves as a gate electrode of the drain-side select gate transistor of the NAND string.

According to the present embodiment, polysilicon is adopted for the gate electrodes 61 to 6n and 7. However, metals such as tungsten (W), aluminum (Al) and copper (Cu) may be used instead. Furthermore, silicon oxide, born phosphorus silicate glass (BPSG), and boron silicate glass (BSG) may be used for the interlayer insulation layer 5.

Figure 12:
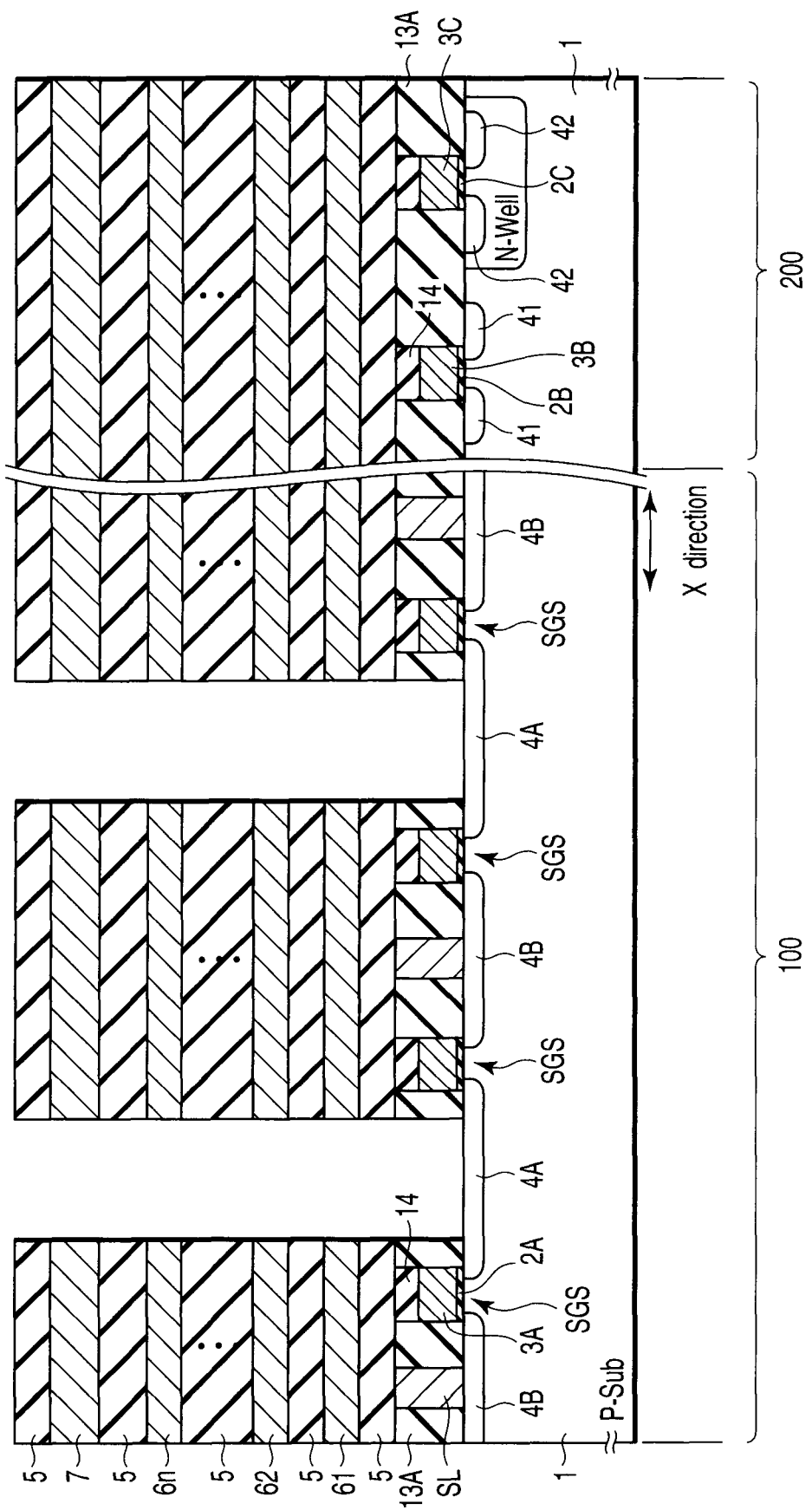
FIG. 12 is a view of a structure at still another step of the manufacturing process according to the embodiment.

As illustrated in FIG. 12, the interlayer insulation layer 5 and the gate electrodes 61 to 6n and 7 are selectively etched by photo etching process (PEP) and reactive ion etching (RIE) so that an opening is formed in the structure in a manner that the surface of the diffusion layer 4A that serves as a drain region of the select gate transistor SGS is exposed.

Figure 13:
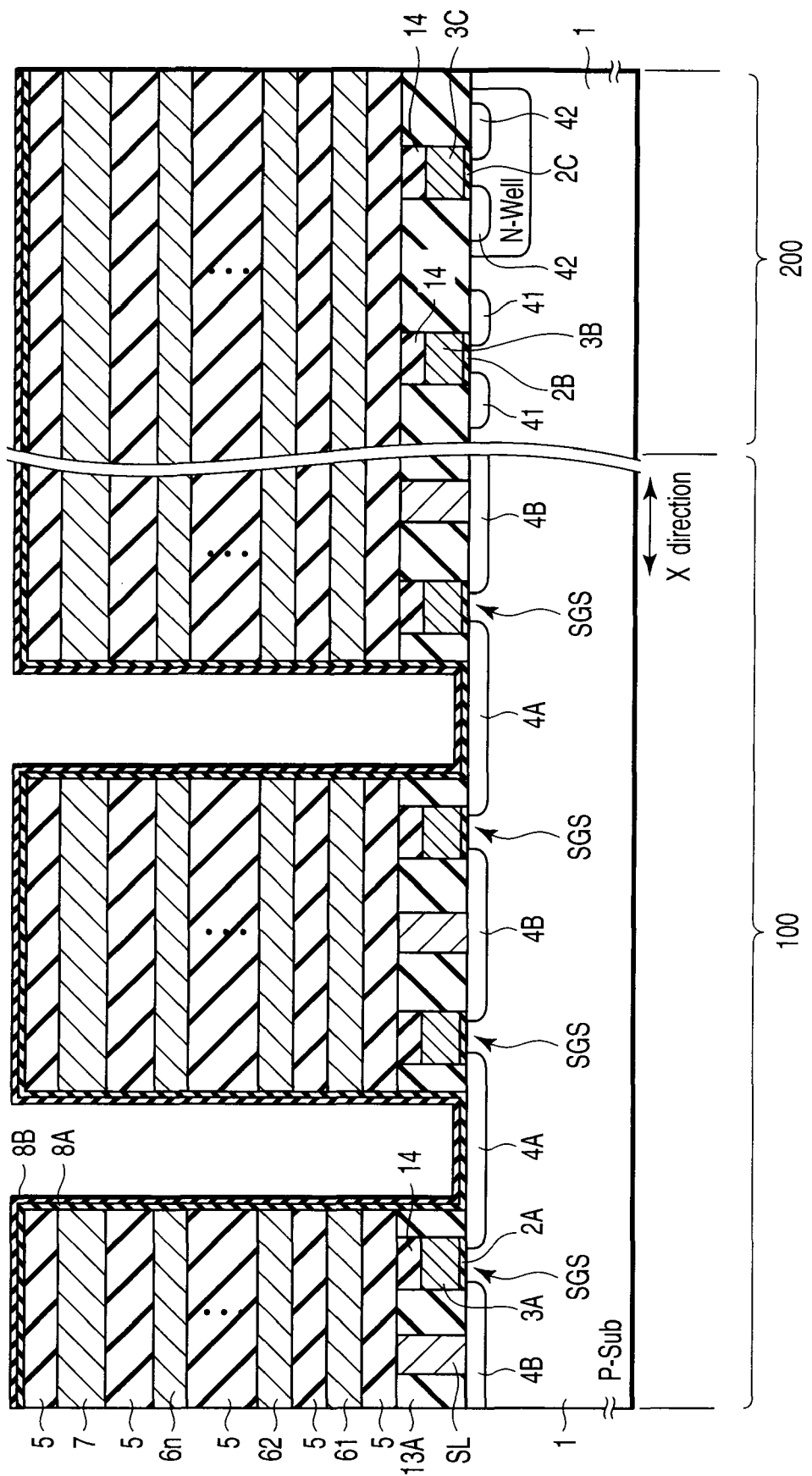
FIG. 13 is a view of a structure at still another step of the manufacturing process according to the embodiment.

As illustrated in FIG. 13, the first insulating film 8A (a silicon oxide film, for example) and the charge storage layer 8B (a silicon nitride film, for example) are sequentially deposited by CVD on the side surfaces of the interlayer insulation layers 5 and the gate electrodes 61 to 6n and 7 that face the opening.

Figure 14:
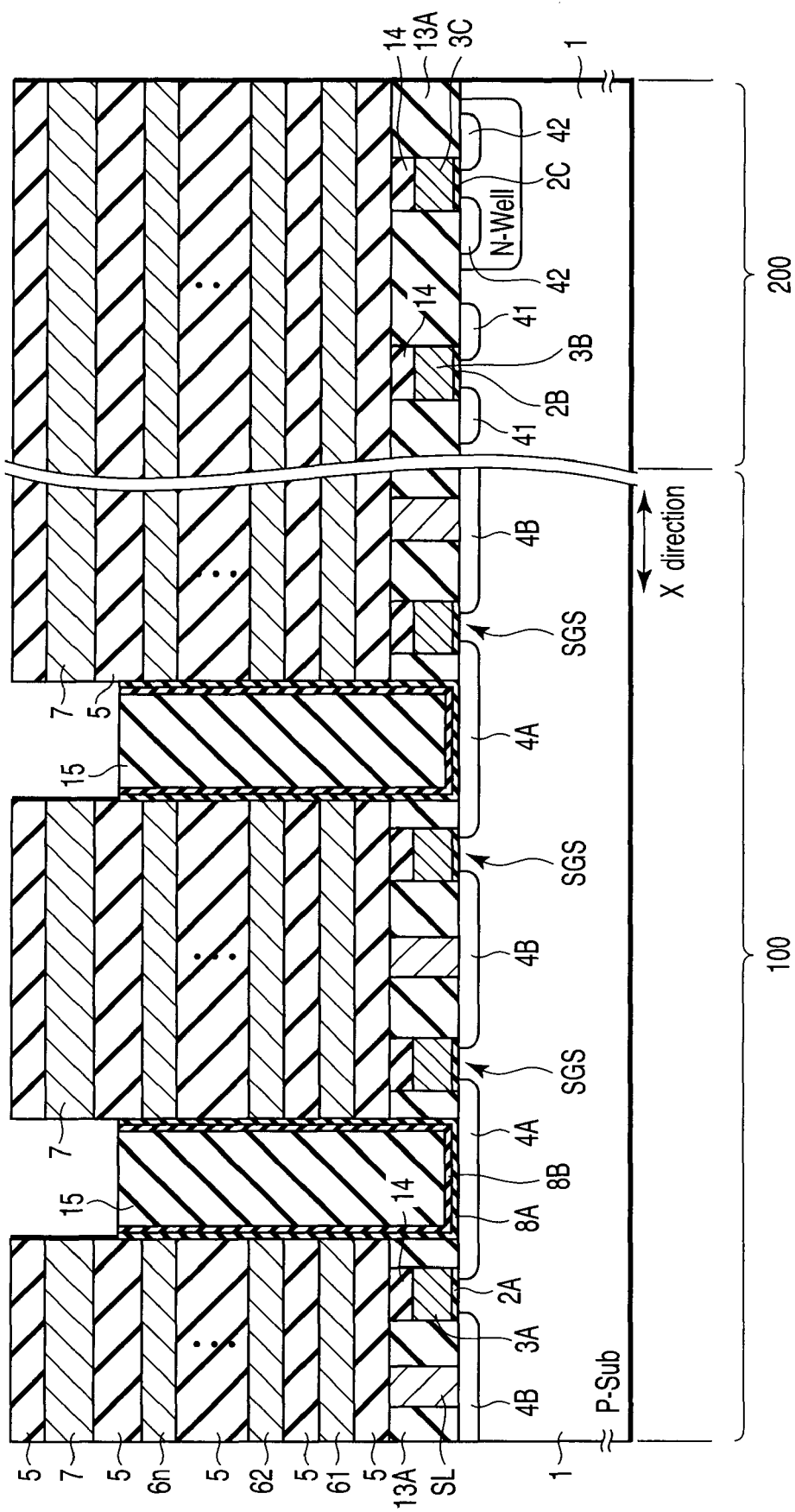
FIG. 14 is a view of a structure at still another step of the manufacturing process according to the embodiment.

An insulating film 15 is deposited on the charge storage layer 8B, as illustrated in FIG. 14. The top surface of the insulating film 15 is designed to be above the top surface of the polysilicon layer 6n but below the bottom surface of the gate electrode 7. The portions of the charge storage layer 8B and the first insulating film 8A that extend above the top surface of the insulation layer 15 are etched off.

Figure 15:
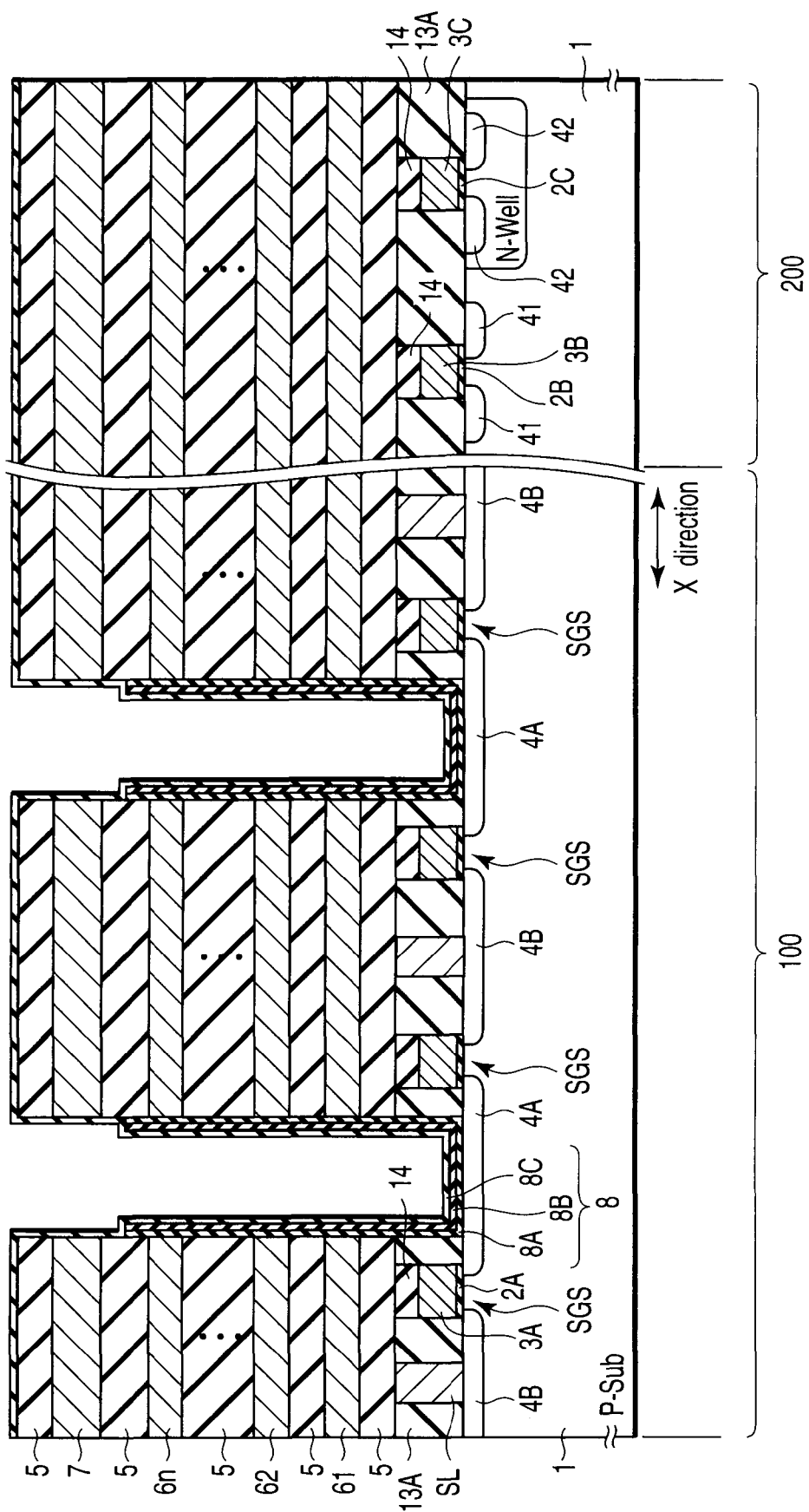
FIG. 15 is a view of a structure at still another step of the manufacturing process according to the embodiment.

After the insulation layer 15 is removed, the second insulation layer 8C is formed on the charge storage layer 8B and also on the side surface of the gate electrode 7, as illustrated in FIG. 15.

Figure 16:
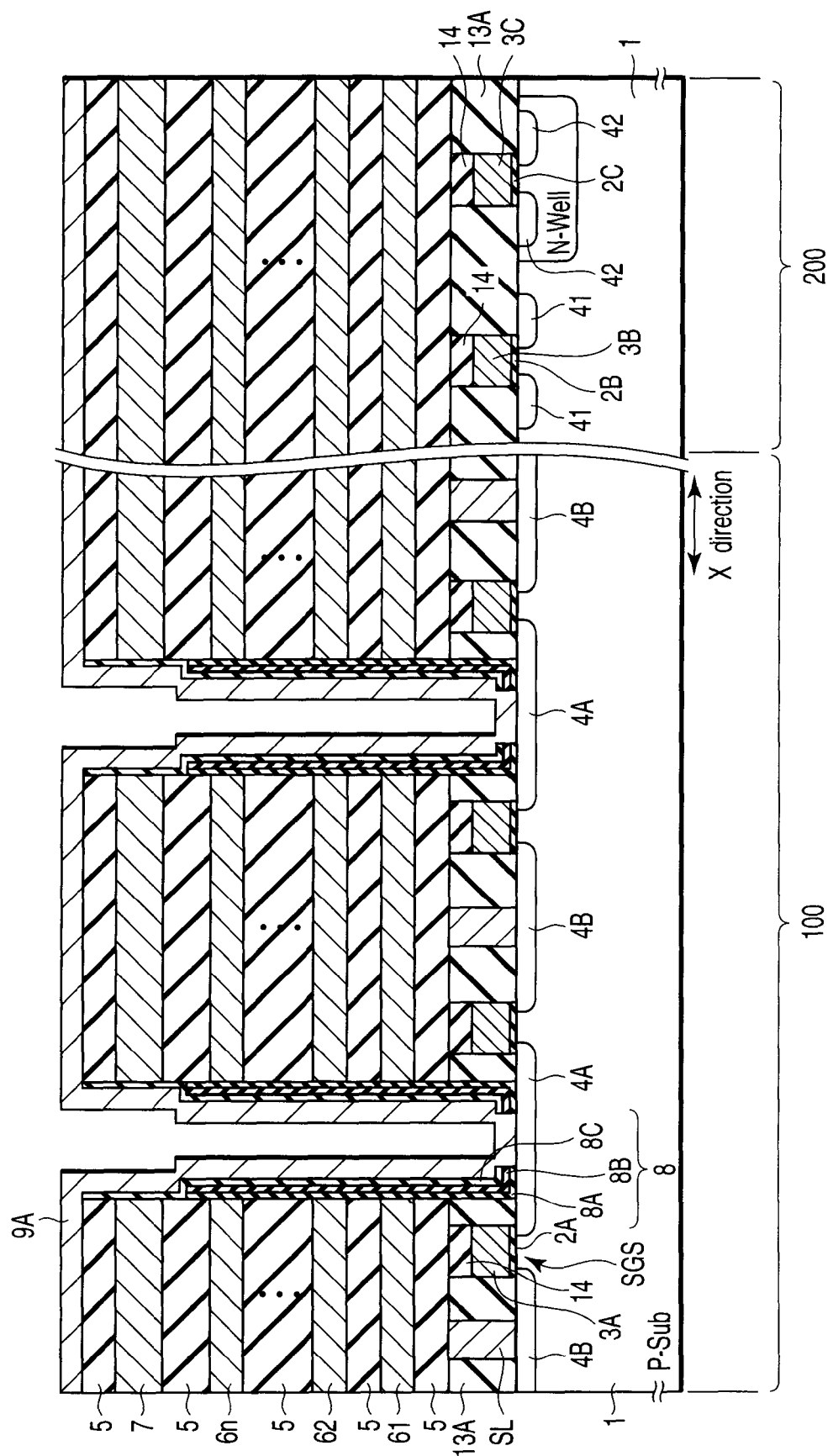
FIG. 16 is a view of a structure at still another step of the manufacturing process according to the embodiment.

As illustrated in FIG. 16, the first insulating film 8A, the charge storage layer 8B, and the second insulating film 8C are sequentially and selectively etched by anisotropic etching, leaving an N$^-$-type semiconductor layer 9 on the semiconductor substrate 1 as well as on the top and side surfaces of the first insulating film 8A. The N$^-$-type semiconductor layer 9 is brought into contact with the diffusion layer 4A. The N$^-$-type semiconductor layer 9 is formed of polysilicon doped with phosphorous (P) or arsenic (As) in low concentration (about $1\times10^{18}$ atom/cm$^3$, for example). Here, the N$^-$-type semiconductor layer 9 may be formed as an epitaxial layer by epitaxially growing polysilicon in such a manner that the crystal axis of the N$^-$-type semiconductor layer 9 matches that of the semiconductor substrate 1. The memory cells arranged on the crystallized N$^-$-type semiconductor layer 9 are provided with enhanced element characteristics such as increased carrier mobility.

Figure 17:
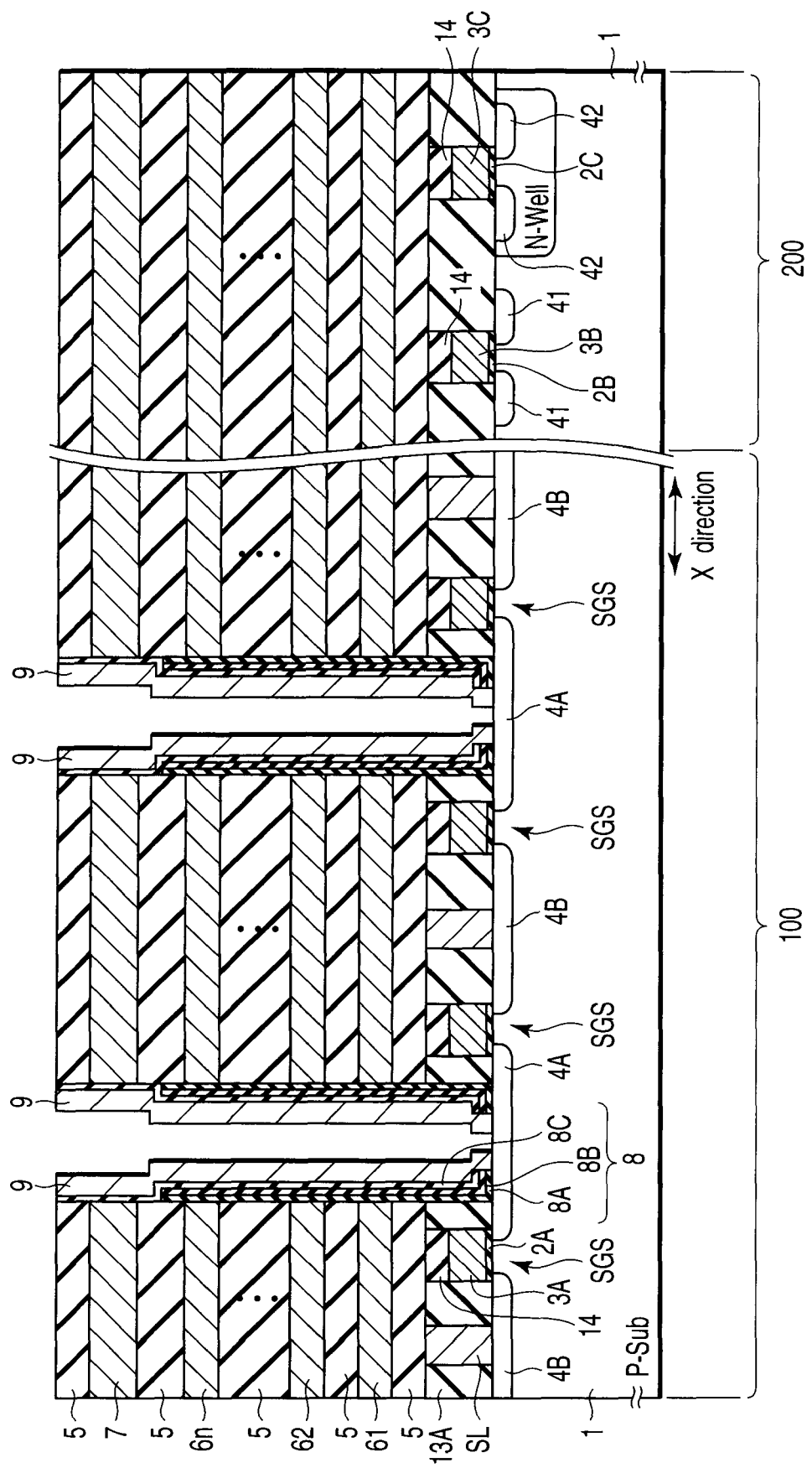
FIG. 17 is a view of a structure at still another step of the manufacturing process according to the embodiment.

The N$^-$-type semiconductor layer 9 is selectively etched in an anisotropic etching process, as illustrated in FIG. 17. As a result, the top surface of the semiconductor substrate 1 is partially exposed, thereby dividing the N$^-$-type semiconductor layer 9 for each NAND cell unit with respect to the X direction.

Figure 18:
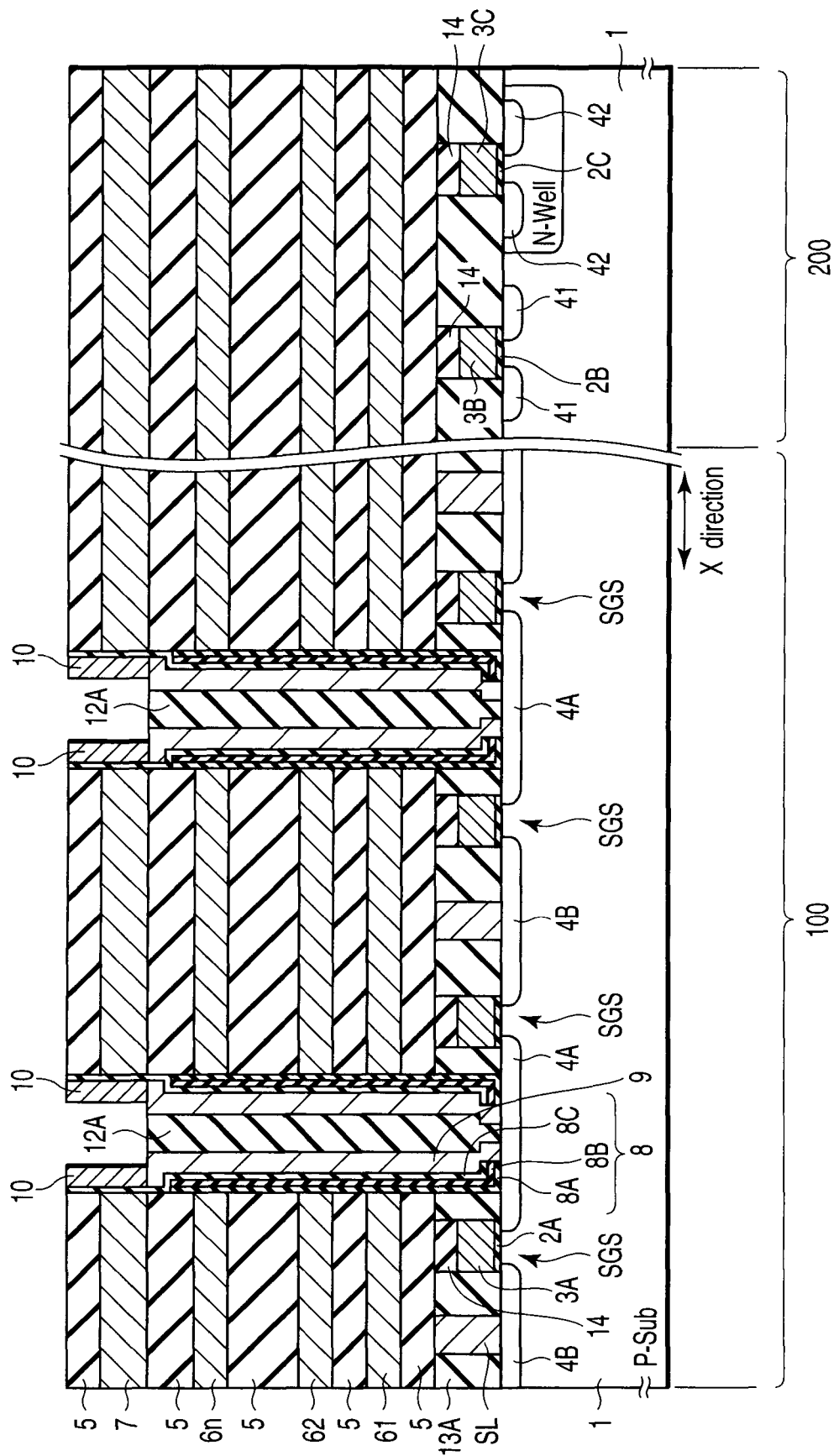
FIG. 18 is a view of a structure at still another step of the manufacturing process according to the embodiment.

As illustrated in FIG. 18, an insulation layer 12A is deposited on the side surface of the N$^-$-type semiconductor layer 9 in such a manner as to fill in the opening. The top surface of the insulation layer 12A is approximately at the same height as the bottom surface of the gate electrode 7. Thereafter, P-type impurities (such as boron (B)) are introduced in low concentrations (about $1\times10^{18}$ atom/cm$^3$, for example) into the exposed portion of the semiconductor layer above the top surface of the insulation layer 12A by gas phase doping (GPD). Then, the P$^-$-type semiconductor layer 10 is formed as a channel region of the select gate transistor on the drain side.

Figure 19:
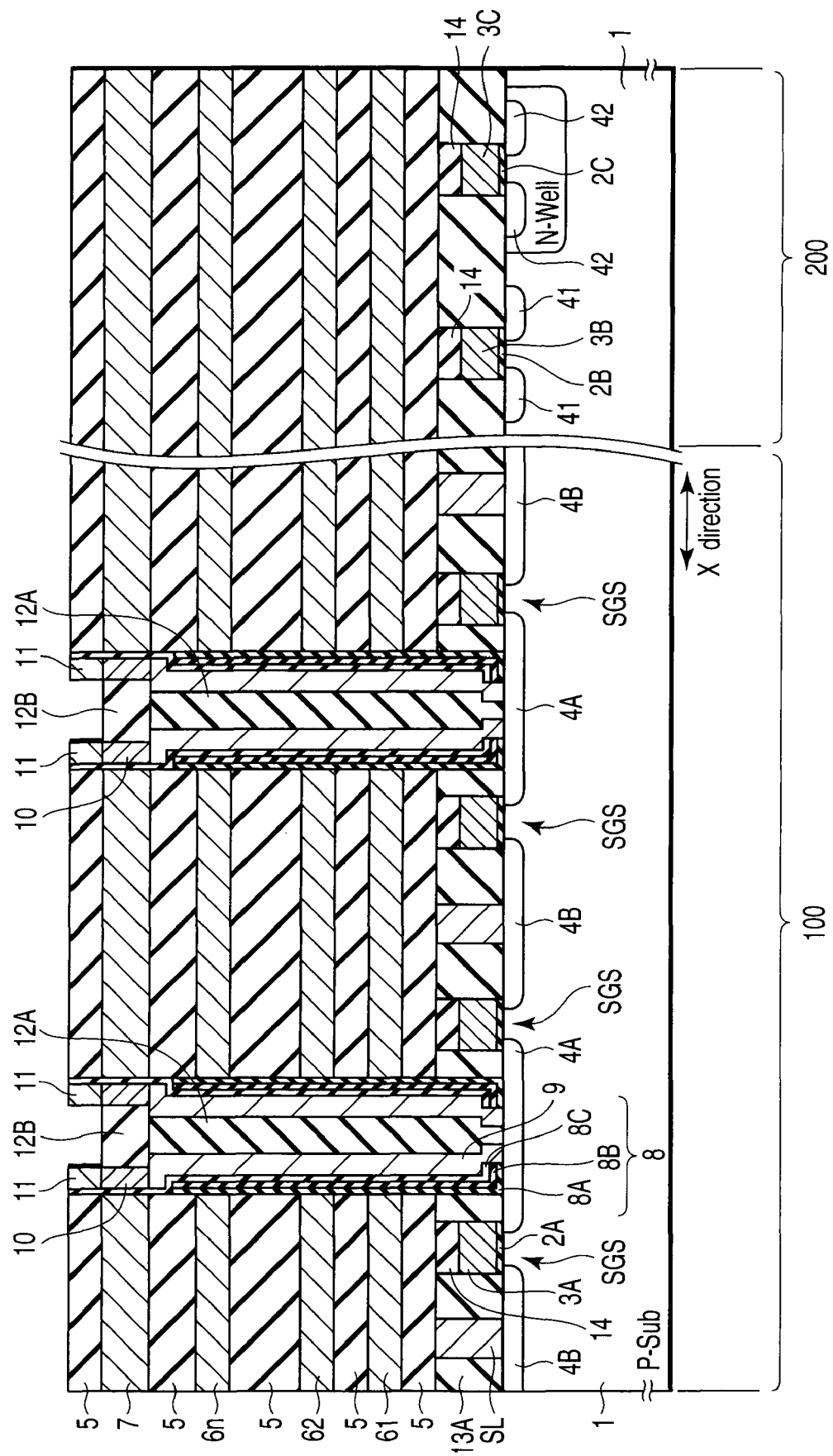
FIG. 19 is a view of a structure at still another step of the manufacturing process according to the embodiment.

As illustrated in FIG. 19, an insulation layer 12B is formed on the insulation layer 12A. The top surface of the insulation layer 12B is designed to be approximately at the same height as the top surface of the gate electrode 7. Then, N-type impurities are introduced in high concentrations (about $1\times10^{20}$ atom/cm$^3$, for example) into the exposed portion of the semiconductor layer above the top surface of the insulation layer 12B. An N$^+$-semiconductor layer 11 is thereby formed as a drain region of the select gate transistor.

Figure 20:
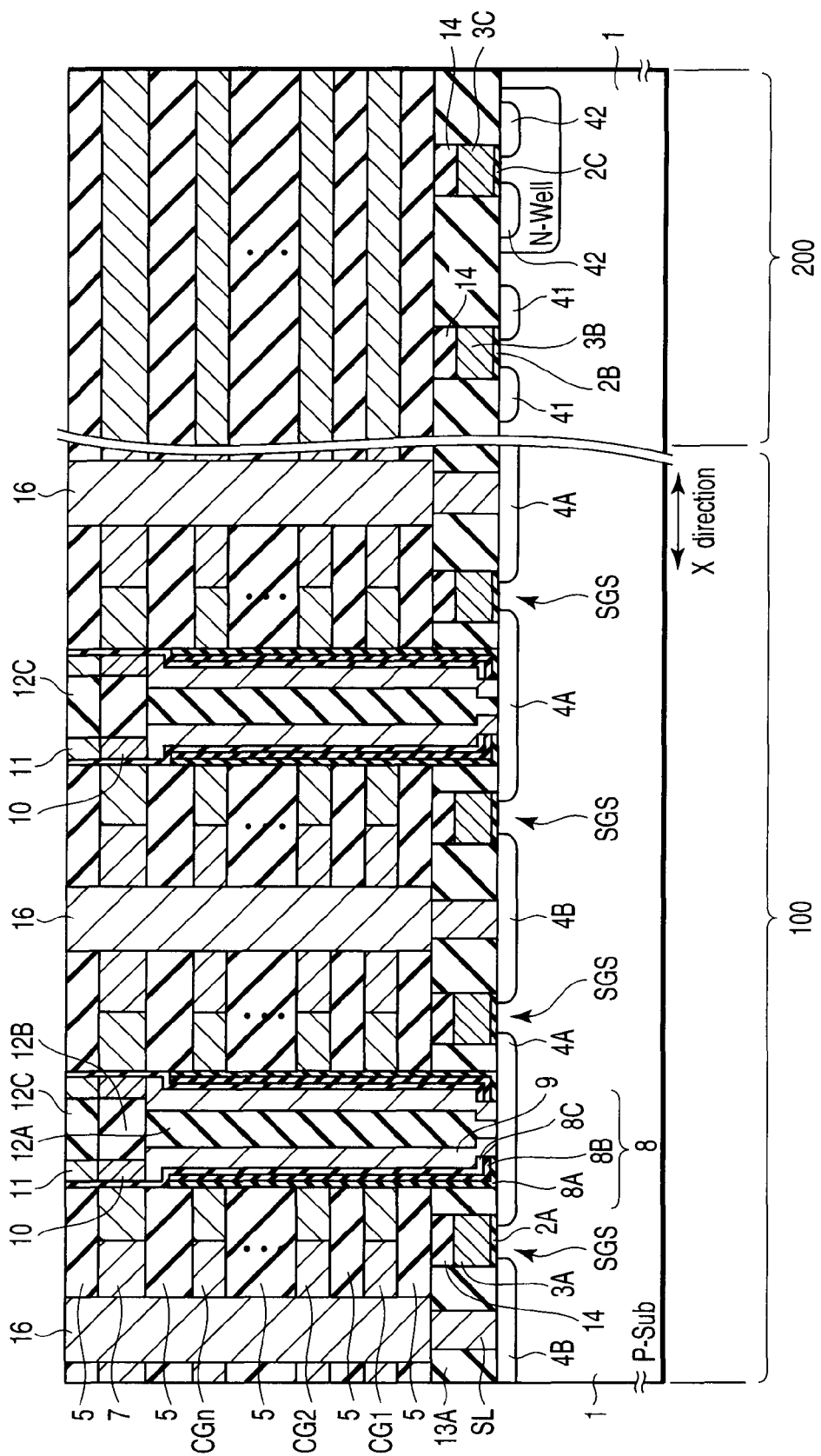
FIG. 20 is a view of a structure at still another step of the manufacturing process according to the embodiment.

An insulation layer 12C is formed on the insulation layer 12B, as illustrated in FIG. 20. Then, in order to obtain multiple units, the semiconductor layers 9, 10 and 11 are selectively etched by anisotropic etching by use of masks (not shown in the drawing) formed in certain intervals in the Y direction on the semiconductor layer 11 and the insulation layer 12C to extend in the X direction. The semiconductor layers are separated in the Y direction in correspondence with individual NAND cell units, and pillar-shaped semiconductor layers are obtained. An insulation layer (not shown in the drawing) is formed to fill in the grooves formed in this etching process. The process of separating the semiconductor layers 9, 10 and 11 in the Y direction into pillars in correspondence with the individual NAND cell units is not limited to the above processing procedure. For instance, the process may be executed at the same timing as the process of separating the N$^-$-type semiconductor layer 9 in the X direction.

The regions above the source line SL, the gate electrodes 61 to 6n and 7 and the interlayer insulating films 5 are selectively etched by anisotropic etching to form an opening. The opening is filled with a high-melting point metal 16 such as tungsten (W), titanium (Ti), molybdenum (Mo), and the like. With a heat treatment, the polysilicon of the gate electrodes is silicided, thereby providing control gate electrodes CG1 to CGn and a gate electrode 7 having a low-resistance silicide layer.

Figure 21:
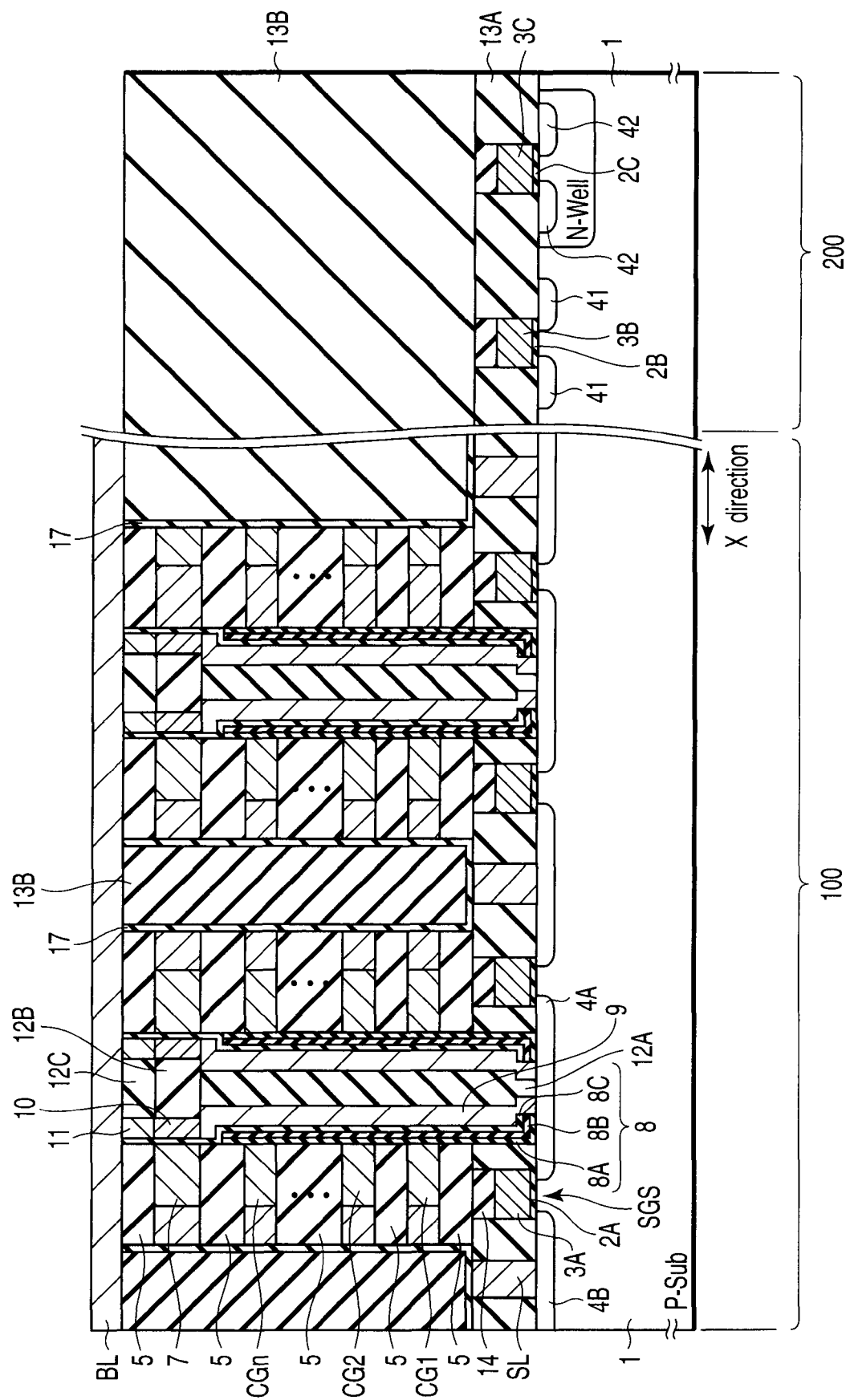
FIG. 21 is a view of a structure at still another step of the manufacturing process according to the embodiment.

After removing the high-melting point metal 16 formed in the opening and the interlayer insulation layers 5 and the gate electrode material formed in the peripheral region, a passivation film 17 and an insulation layer 13B are sequentially formed in the opening, as illustrated in FIG. 21. Furthermore, after a metal film is deposited on the entire top surface of the layer structure, the metal film is subjected to patterning. The metal film is selectively etched in accordance with the pattern, the bit line BL is electrically connected to the N$^+$-type semiconductor layer 11. As a result of the above process, the NAND-type flash memory according to the present embodiment is completed.

In the NAND-type flash memory including vertical memory cells according to the present embodiment, the select gate transistor at the bottom end is formed on the semiconductor substrate 1 before the process of forming vertical memory cells on the pillar-shaped semiconductor layers and the top-end select gate transistors. Thus, a high level of processing technique such as removal of a charge storage layer is not required to form the bottom-end select gate transistor as a MIS transistor in which a threshold voltage can be easily controlled.

In addition, the peripheral transistors are formed at the same timing as the select gate transistors formed on the semiconductor substrate.

Thus, the peripheral transistors are formed where there is no height difference between the memory cell array region and the surface of the semiconductor substrate such as forming an element in the peripheral circuit region 200 after forming an element in the memory cell array region 100. This lowers the level of difficulty in processing the NAND-type flash memory that includes vertical memory cells.

(C) Modified Embodiments

Figure 22:
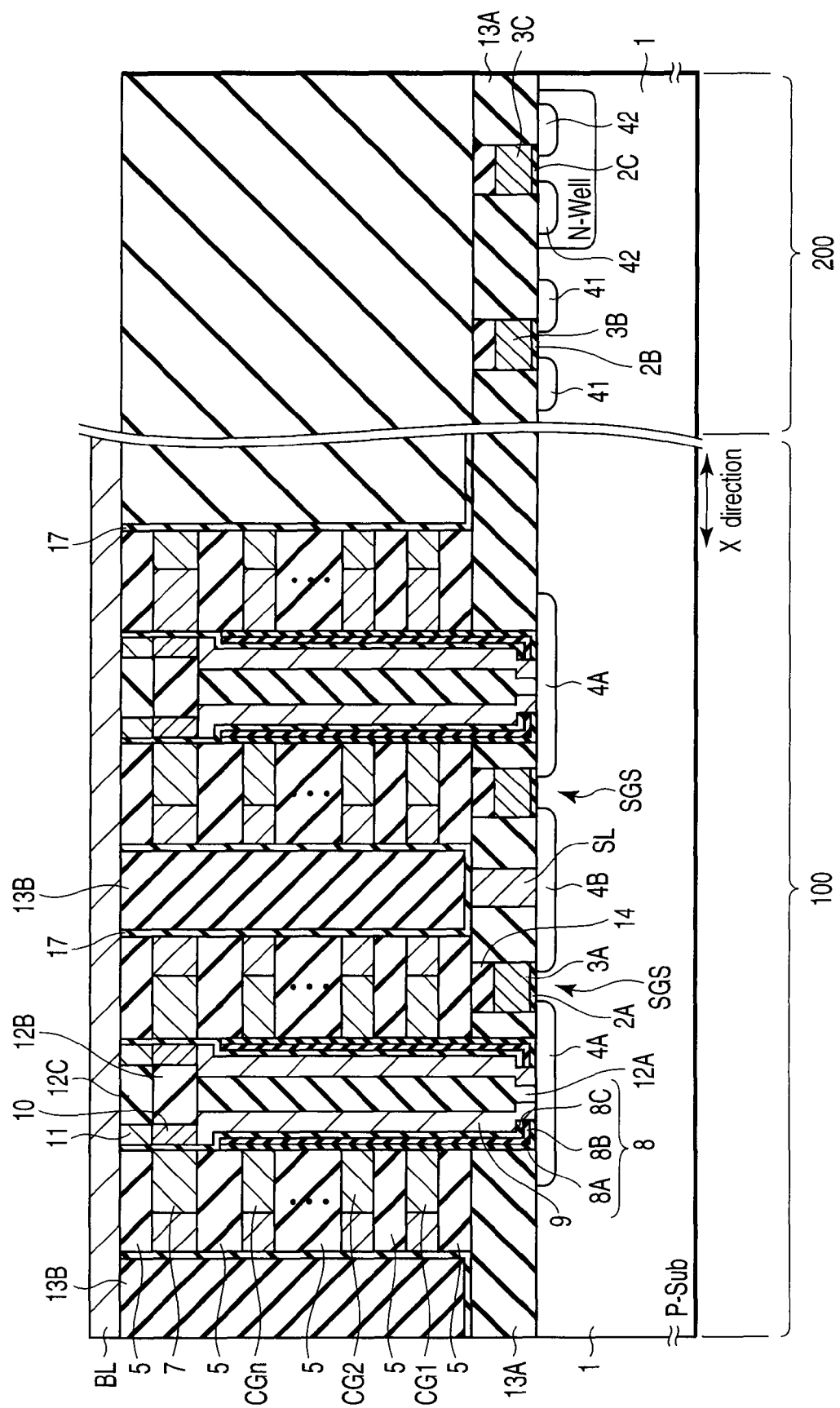
FIG. 22 is a cross-sectional view of a structure according to a modified example.

FIG. 22 is a cross-sectional view of a structure according to a modified embodiment. The same reference numbers are assigned to the same components as those in FIGS. 8 and 9, and detailed explanations thereof are omitted.

As illustrated in FIG. 22, a single source-side select gate transistor SGS is arranged in correspondence with two NAND strings.

In the above structure, fewer source lines SL and select gate transistors SGS are required, which means that the space between the source lines and the select gate transistors required in consideration of dielectric withstand voltages is reduced in accordance with the omitted source lines and select gate transistors.

For this reason, the above structure can reduce the chip area.

3. Others

According to the embodiments of the present invention, the difficulty in processing a nonvolatile semiconductor memory is lowered, and a nonvolatile semiconductor memory that can be easily provided with a finer pattern is offered.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
a semiconductor substrate;
a pillar-shaped semiconductor layer extending in a vertical direction with respect to a surface of the semiconductor substrate;
a plurality of memory cells arranged in the vertical direction on a side surface of the semiconductor layer and having a charge storage layer and a control gate electrode;
a first select gate transistor arranged on the semiconductor substrate; and
a second select gate transistor arranged on the semiconductor layer on an end of the memory cells opposite to a side of the semiconductor substrate,
wherein the first select gate transistor includes first and second diffusion layers as source and drain regions in the semiconductor substrate and is electrically connected to the pillar-shaped semiconductor layer by way of the second diffusion layer.

2. The nonvolatile semiconductor memory according to claim 1, wherein a gate electrode of the first select gate transistor is arranged under a control gate electrode of a memory cell with an interlayer insulating film interposed therebetween.

3. The nonvolatile semiconductor memory according to claim 1, further comprising:
a source line connected to the first select gate transistor;
wherein a top surface of the source line is at a lower height than a bottom surface of the control gate electrode of a memory cell that is positioned closest to the semiconductor substrate among the plurality of memory cells.

4. The nonvolatile semiconductor memory according to claim 1, wherein the first and second select gate transistors are enhancement-type MIS transistors.

5. The nonvolatile semiconductor memory according to claim 1, wherein each of the memory cells is a depression-type MONOS-structured transistor.

6. The nonvolatile semiconductor memory according to claim 5, wherein the memory cells further include a first insulating film interposed between the control gate electrode and the charge storage layer, and a second insulating film interposed between the charge storage layer and the semiconductor layer.

7. The nonvolatile semiconductor memory according to claim 6, wherein a gate insulation layer having a same structure as the second insulating film is arranged between the gate electrode of the second select gate transistor and the semiconductor layer.

8. The nonvolatile semiconductor memory according to claim 1, wherein the gate electrode of the second select gate transistor has a gate length greater than a length of the control gate electrode of a memory cell.

9. The nonvolatile semiconductor memory according to claim 1, further comprising a peripheral transistor disposed on the semiconductor substrate,
wherein a material of a gate insulating film of the peripheral transistor is same as a material of a gate insulating film of the first select gate transistor.

10. A nonvolatile semiconductor memory comprising:
a semiconductor substrate;
first and second pillar-shaped semiconductor layers extending in a vertical direction with respect to a surface of the semiconductor substrate;
a plurality of first memory cells arranged in the vertical direction on a side surface of the first semiconductor layer and having a charge storage layer and a control gate electrode;
a first drain-side select gate transistor arranged on the side surface of the first semiconductor layer at an end of the first memory cells opposite to the semiconductor substrate;
a plurality of second memory cells arranged in the vertical direction on a side surface of the second semiconductor layer and having a charge storage layer and control gate electrodes;
a second drain-side select gate transistor arranged on a side surface of the second semiconductor layer at an end of the second memory cells opposite to the semiconductor substrate; and
a source-side select gate transistor arranged on the semiconductor substrate,
wherein the source-side select gate transistor includes diffusion layers that serves as source and drain regions in the semiconductor substrate and is electrically connected to the first and second semiconductor layers by way of the diffusion layer that serves as the drain region.

11. The nonvolatile semiconductor memory according to claim 10, further comprising a source line connected to the diffusion layer that serves as the source region of the source-side select gate transistor,
wherein a top surface of the source line is positioned at a lower height than a bottom surface of the control gate electrode of a memory cell that is arranged closest to the semiconductor substrate among the first and second memory cells.

12. The nonvolatile semiconductor memory according to claim 10, wherein the first and second memory cells are depression-type MONOS-structured transistors.

13. The nonvolatile semiconductor memory according to claim 12, wherein the first and second memory cells further include a first insulating film interposed between the control gate electrodes and the charge storage layer, and a second insulating film interposed between the charge storage layer and the first and second semiconductor layers.

14. The nonvolatile semiconductor memory according to claim 13, wherein a gate insulating film that has a same structure as the second insulating film is deposited between the gate electrodes of the first and second drain-side select gate transistors and the first and second semiconductor layers.

15. The nonvolatile semiconductor memory according to claim 10, wherein the first and second select gate transistors are enhancement-type MIS transistors.

16. The nonvolatile semiconductor memory according to claim 1, wherein the second select gate transistor use the same insulating film as an insulating film between the charge storage layer and the control gate electrode as a gate insulating film.

17. The nonvolatile semiconductor memory according to claim 10, wherein the second select gate transistor use the same insulating film as an insulating film between the charge storage layer and the control gate electrode as a gate insulating film.

* * * * *